(12) United States Patent
Takimoto et al.

(10) Patent No.: US 6,433,366 B1
(45) Date of Patent: Aug. 13, 2002

(54) CIRCUIT-INCORPORATING LIGHT RECEIVING DEVICE AND METHOD OF FABRICATING THE SAME

(75) Inventors: Takahiro Takimoto, Tenri; Naoki Fukunaga, Soraku-gun; Isamu Ohkubo, Kashiba; Toshimitsu Kasamatsu, Tenri; Mutsumi Oka, Joyo; Masaru Kubo, Kitakatsuragi-gun, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/616,961

(22) Filed: Jul. 14, 2000

(30) Foreign Application Priority Data

Jul. 27, 1999 (JP) .......................... 11-212914

(51) Int. Cl.[7] .............................. H01L 27/14
(52) U.S. Cl. ...................... 257/83; 257/84; 257/431; 257/577
(58) Field of Search .................. 257/83, 84, 444, 257/577, 431

(56) References Cited

U.S. PATENT DOCUMENTS

| | | | |
|---|---|---|---|
| 5,177,581 A | | 1/1993 | Kubo et al. |
| 5,410,175 A | * | 4/1995 | Kyomasu et al. ............ 257/458 |
| 5,466,962 A | * | 11/1995 | Yamamoto et al. .......... 257/437 |
| 5,488,251 A | * | 1/1996 | Mizutani et al. ............. 257/557 |
| 5,598,022 A | * | 1/1997 | Kyomasu ..................... 257/458 |
| 5,602,415 A | | 2/1997 | Kubo et al. |
| 6,060,732 A | * | 5/2000 | Murakami et al. ........... 257/215 |
| 6,114,740 A | * | 9/2000 | Takimoto et al. ............ 257/461 |
| 6,252,286 B1 | * | 6/2001 | Arai ............................ 257/446 |

FOREIGN PATENT DOCUMENTS

| | | | | |
|---|---|---|---|---|
| JP | 61-270859 | 12/1986 | | |
| JP | 63-281458 | 11/1988 | | |
| JP | 4-152531 | 5/1992 | | |
| JP | 4-152670 A | * 5/1992 | ................. | 257/461 |
| JP | 9-307086 | 11/1997 | | |
| JP | 2731115 | 12/1997 | | |
| JP | 10-107243 | 4/1998 | | |

* cited by examiner

*Primary Examiner*—Allan R. Wilson
(74) *Attorney, Agent, or Firm*—Nixon & Vanderhye P.C.

(57) ABSTRACT

A circuit-incorporating light receiving device includes an integrated circuit and a photodiode. The integrated circuit and the photodiode are provided on a single semiconductor substrate. The integrated circuit includes a transistor having a polycrystalline silicon as an emitter diffusion source and an electrode. Elements included in the integrated circuit are isolated from each other using local oxidization.

9 Claims, 27 Drawing Sheets

CIRCUIT-INCORPORATING LIGHT RECEIVING DEVICE AND METHOD OF FABRICATING THE SAME

BACKGROUND OF THE INVENTION

1. Field of the Invention

The present invention relates to a circuit-incorporating light receiving device in which a photodiode for converting received light into an electrical signal and an integrated circuit for processing the converted signal are provided on a single silicon substrate, and to a method for fabricating the circuit-incorporating light receiving device.

2. Description of the Related Art

Circuit-incorporating light receiving devices are mainly used in optical pickups. For example, the circuit-incorporating light receiving devices detect a focus error signal which is in turn used to bring light of a semiconductor laser to a focus on a disk. Alternatively, the devices may detect a radial error signal which is in turn used to bring laser light to a pit on a disk (tracking). Recently, optical pickups are used in CD-ROM or DVD-ROM drives and the like which are becoming increasingly faster. There is a demand for a high-speed and high-performance circuit-incorporating light receiving device which may be used in such optical pickups.

FIG. 10 shows a conventional circuit-incorporating light receiving device 500 (Japanese Patent Publication No. 2731115) which has a split photodiode structure. A feature of the split photodiode structure shown in FIG. 10 is that an N-type buried diffusion layer 103 and a P-type diffusion layer 109 are provided so as to reduce a diffusion current having a slow response. A semiconductor substrate 101 is made of P-type <111> 40 Ωcm so as to reduce a junction capacitance. The use of such a material leads to expansion of a depletion layer, resulting in a decrease in a distance over which diffusing carriers having a low mobility are moved. For this reason, the response of a photodiode is improved. The photodiode portion of the device 500 attains a response of about 30 MHz as fc(−3 dB).

A silicon nitride film 111 as an antireflection film is further provided on the P-type diffusion layer 109. The reflectance of the device 500 is thus reduced with respect to a laser wavelength of about 780 nm which is used for a CD-ROM.

In the integrated circuit portion of the circuit-incorporating light receiving device 500, elements are isolated from each other using PN junction isolation. Arsenic (As+) and Boron (B+) are implanted into an emitter and a base, respectively, with ion implantation. A resulting NPN transistor has a fTmax of about 3 GHz. The integrated circuit portion of the device 500 attains a response of about 20 MHz.

Hereinafter, a fabrication process of the circuit-incorporating light receiving device 500 will be described with reference to FIGS. 11A through 11H.

On the P-type <111> 40 Ωcm substrate 101, as shown in FIG. 11A, a P-type buried diffusion layer 102 is provided in an isolation region and a region splitting the photodiode. The N-type buried diffusion layer 103 is provided in the photodiode portion for the purpose of improving the response of the split photodiode. The N-type buried diffusion layer 103 is provided in the NPN transistor portion. An N-type epitaxial layer 104 is provided on the buried diffusion layers 102 and 103.

Next, as shown in FIG. 11B, a P-type diffusion layer 105, a base region (not shown) of a vertical PNP (V-PNP) transistor, and a collector compensation diffusion layer 106 of the NPN transistor portion are provided.

Next, as shown in FIG. 11C, boron ion implantation provides the base region (internal base region 107 and external base region 108) of the NPN transistor; the emitter region (not shown) of the V-PNP transistor; and the P-type diffusion layer 109 for improving the response of the split photodiode.

Next, as shown in FIG. 11D, an emitter region 110 of the NPN transistor is provided by arsenic ion implantation.

Next, as shown in FIG. 11E, a field silicon oxidization film is removed from a split photodiode light receiving region. The silicon nitride film 111 is provided on the split photodiode light receiving region by CVD. In this way, an antireflection film having the intended thickness can be obtained.

Next, as shown in FIG. 11F, a silicon oxidization film of a contact portion is etched. A first layer conductor 112A made of AlSi is then provided by sputtering. A conductor portion 112 is provided by dry etching. In this case, a portion of AlSi which exists on the light receiving region of the split photodiode is not etched. The reasons are follows. The dry etching reduces the silicon nitride film 111 as the antireflection film. Plasma generated in the dry etching damages the photodiode, degrading the leakage characteristic of the photodiode.

Next, an interlayer insulating film 113 is provided and a through hole is provided in the integrated circuit. The interlayer insulating film 113 provided on the photodiode is removed by etching. As shown in FIG. 11G, an AlSi film is provided by sputtering and then patterned to provide a second layer conductor 114 while removing AlSi from the photodiode light receiving region.

Finally, as shown in FIG. 11H, the second layer conductor 114 and the split photodiode portion (first layer conductor 112A and second layer conductor 114) which are made of AlSi are etched by wet etching. Dry etching would reduce the silicon nitride film 111 as the antireflection film and degrades the leakage characteristic of the photodiode. Thereafter, a cover insulating film 115 is provided.

Thus, the circuit-incorporating light receiving element 500 shown in FIG. 10 is obtained. Recently, there is a demand for a high-speed circuit-incorporating light receiving device. An attempt is made to achieve a high-speed split photodiode and a high-speed integrated circuit.

To obtain a higher-speed split photodiode, a CR time constant needs to be decreased. Specifically, photodiode capacitance Cpd or series resistance Rs needs to be decreased.

Japanese Laid-Open Publication No. 10-107243 proposes an exemplary structure of a photodiode shown in FIG. 12. Such a structure provides the N-type buried diffusion layer 103 only on a portion which actually receives laser light from a semiconductor laser. This photodiode has a reduced junction area and thus achieves a reduction in junction capacitance while retaining the improved response due to the structure shown in FIG. 10. In this case, in an area receiving light, there is a junction between the P-type diffusion layer 109 and the N-type epitaxial layer 104. For this reason, a silicon thermal oxidation film 116 as an antireflection film is required. If a deposition film is provided directly on a silicon film by CVD or the like, there is an increased leakage current at the junction between the P-type diffusion layer 109 and the N-type epitaxial layer 104, which are positioned at a surface portion. To avoid this, the silicon thermal oxidation film 116 is provided.

Each transistor needs to become fast to obtain a high-speed integrated circuit. In the case of an NPN transistor, for example, an effective way is to reduce the capacitance between the emitter and the base. To this end, impurity concentrations of the emitter and the base need to be decreased or an area between the emitter and the base needs to be decreased. However, the former strategy is not available because the carrier injection efficiency is reduced and the current amplification factor (hFE) is thus decreased.

To achieve a reduced area between the emitter and the base, an attempt is made to develop a lithography technique such that an alignment margin of a mask is reduced as much as possible. A structural approach is also made to minimize the area between the emitter and the base. For example, polycrystalline silicon which is doped with an N-type semiconductor such as arsenic is used as an emitter diffusion source (polycrystalline silicon emitter) or an electrode. In such a technique, emitter diffusion and the alignment margin of the contact are not necessary. The area between the emitter and the base thus can be reduced, thereby reducing the capacitance between the emitter and the base.

The use of the polycrystalline silicon emitter also allows formation of a shallow emitter diffusion and a base diffusion. The width of the base can also be reduced, thereby obtaining a higher-speed photodiode.

The use of the polycrystalline silicon emitter is also effective in reducing the capacitance between the base and the collector. The reduced emitter area leads to a reduction in the base area.

For the purpose of isolation, LOCOS (local oxidization of silicon) may be used. This technique allows formation of a walled base structure which can reduce the capacitance between the base and the collector. The capacitance between the collector and the substrate also can be reduced.

The use of the above-described polycrystalline silicon emitter leads to an improvement in fTmax of the NPN transistor from about 3 GHz (for the conventional NPN transistors) to about 6 GHz.

There are a number of problems with the above-described high-speed circuit-incorporating light receiving device in which the split photodiode shown in FIG. 12 and the high-speed integrated circuit having the polycrystalline silicon emitter and the LOCOS are provided on a single substrate.

The problems are classified into two groups, namely problems A and B. Problem A is in connection with formation of the antireflection film on the split photodiode and problem B is in connection with a LOCOS process of isolation. Problem A includes the following:

A1. a reduction in yield of the transistor;

A2. variations in transistor characteristics due to variations in the thickness of the through oxidization films; and A3. a reduction in the antireflection film (an increase in a reflectance and an increase in variation).

These problems will be described below.

A1. a reduction in yield of the transistor

The split photodiode shown in FIG. 12 has an increased leakage current at a light receiving surface thereof when a deposition film as an antireflection film is provided by CVD or the like on the junction between the P-type diffusion layer 109 and the N-type epitaxial layer 104 and on a light receiving surface of the split photo diode. For this reason, as the antireflection film, the silicon thermal oxidization film 116 is required. To this end, a polycrystalline silicon doped with an N-type semiconductor such as arsenic is provided; emitter diffusion is thereafter obtained by carrying out an appropriate thermal treatment; and thermal oxidization is carried out. It has been found, however, that a yield of the transistors is reduced due to a crystal defect.

A2. variations in transistor characteristics due to variations in the thickness of the through oxidization films.

An inside base region of the NPN transistor is typically provided by ion implantation through an oxidization film (a through oxidization film). Variations in the thickness of the through oxidization film leads to an uneven profile of the impurity concentration of implanted ions. When the formation of the inside base region is carried out after the antireflection film is formed on the photodiode, the through oxidization film on the inside base region is reduced due to the preprocess and etching upon the formation of the antireflection film. This causes variations in the film thickness, i.e., variations in the concentration profile of the inside base region, resulting in variations in transistor characteristics. To avoid this, the through oxidization film may be provided after the formation of the antireflection film. This leads to an increase in manufacturing cost since the silicon oxidization film previously provided needs to be removed and oxidized, i.e., additional processes.

A3. a reduction in the antireflection film (an increase in a reflectance and an increase in variation).

When the polycrystalline silicon emitter is used, a barrier metal needs to be provided between AlSi used for an actual conductor material and the polycrystalline silicon Si. TiW or the like may be used as the barrier metal. Typically, the barrier metal and the conductor (the first layer in the case of multiple conductor layers) are simultaneously provided by sputtering and etching. The etching for the barrier metal is dry etching. Patterning by dry etching is preferable when a reduced width of conductor is required for a small-size IC. However, the antireflection film which has had the intended thickness is etched by the dry etching. The reflectance which has been designed to have the lowest value is thus impaired and variations in the reflectance become significant. Moreover, damage due to plasma generated in the dry etching leads to an increase in leakage current.

B. cross-talk characteristics due to a LOCOS process of isolation.

A isolation diffusion layer 5 (FIG. 13C) is provided in the following way. Typically, a silicon nitride film 7 which determines an active region is provided as shown in FIG. 13A. Boron ions are then implanted into a region which is to be the isolation diffusion layer 5. The boron ions are further pushed downward by LOCOS as shown in FIG. 13C. The LOCOS is applied to all regions which will isolate elements from each other (hereinafter, referred to as LOCOS isolation). A process is generated at an interface between a region which is subjected to the LOCOS and a region which is not subjected to the LOCOS (such a process is hereinafter referred to as a LOCOS process).

Accordingly, the LOCOS process is generated at a separating portion of the split photodiode as shown in FIG. 14. The LOCOS process causes incident light to be scattered, so that the split photodiode cannot receive uniform incident light. This may lead to degradation of cross-talk characteristics.

When a high-speed integrated circuit and a high-speed split photodiode are provided on a single substrate using the polycrystalline silicon emitter and the LOCOS isolation, the above-described problems should be solved.

SUMMARY OF THE INVENTION

According to an aspect of the present invention, a circuit-incorporating light receiving device includes an integrated circuit and a photodiode. The integrated circuit and the photodiode are provided on a single semiconductor substrate. The integrated circuit includes a transistor having a polycrystalline silicon as an emitter diffusion source and an electrode. Elements included in the integrated circuit are isolated from each other using local oxidization.

In one embodiment of this invention, the semiconductor substrate includes a semiconductor substrate of a first conductivity type. The photodiode includes a first semiconductor layer of a second conductivity type provided on the semiconductor substrate of the first conductivity type and a semiconductor layer of the first conductivity type splitting the first semiconductor layer of the second conductivity type into a plurality of semiconductor layers of the second conductivity type. The photodiode includes a plurality of split photodiodes for detecting a light signal using the first semiconductor layer of the second conductivity type and the semiconductor layer of the first conductivity type. Light receiving regions of the plurality of split photodiodes and a surface of the semiconductor layer of the first conductivity type are subjected to local oxidization.

In one embodiment of this invention, the semiconductor substrate includes a semiconductor substrate of a first conductivity type. The photodiode includes a first semiconductor layer of a second conductivity type provided on the semiconductor substrate of the first conductivity type and a semiconductor layer of the first conductivity type splitting the first semiconductor layer of the second conductivity type into a plurality of semiconductor layers of the second conductivity type. The photodiode includes a plurality of split photodiodes for detecting a light signal using the first semiconductor layer of the second conductivity type and the semiconductor layer of the first conductivity type. Light receiving regions of the plurality of split photodiodes and a surface of the semiconductor layer of the first conductivity type are not subjected to local oxidization.

In one embodiment of this invention, an antireflection film is provided on a light receiving region of the photodiode. The antireflection film includes a silicon oxidization film.

In one embodiment of this invention, the antireflection film further includes a silicon nitride film provided on the silicon oxidization film.

According to another aspect of the present invention, a method is provided for fabricating a circuit-incorporating light receiving device including an integrated circuit and a photodiode, wherein the integrated circuit and the photodiode are provided on a single semiconductor substrate. The integrated circuit includes a transistor having a polycrystalline silicon as an emitter diffusion source and an electrode. Elements included in the photodiode are isolated from each other using local oxidization. The semiconductor substrate includes a semiconductor substrate of a first conductivity type. The photodiode includes a first semiconductor layer of a second conductivity type provided on the semiconductor substrate of the first conductivity type and a semiconductor layer of the first conductivity type splitting the first semiconductor layer of the second conductivity type into a plurality of semiconductor layers of the second conductivity type. The photodiode includes a plurality of split photodiodes for detecting a light signal using the first semiconductor layer of the second conductivity type and the semiconductor substrate of the first conductivity type. The method includes the processes of: (a) isolating the elements included in the photodiode by the local oxidization; and (b) forming the transistor using the polycrystalline silicon.

In one embodiment of this invention, the plurality of split photodiodes include a first split photodiode and a second split photodiode, and an antireflection film is provided on a light receiving region of the first split photodiode and a light receiving region of the second split photodiode. The antireflection film includes a first silicon oxidization film. The method further includes the processes of: (c) forming the antireflection film on light receiving regions of the plurality of split photodiodes, wherein process (c) is performed before process (b).

In one embodiment of this invention, the antireflection film further includes a silicon nitride film provided on the first silicon oxidization film.

In one embodiment of this invention, the method further includes the process of: (d) forming an inside base region of the transistor in the integrated circuit, wherein process (d) is performed after process (a).

In one embodiment of this invention, the local oxidization is applied to the light receiving regions of the plurality of split photodiodes and a light receiving region of the semiconductor layer of the first conductivity type. The method further includes the process of: (e) forming an inside base region of the transistor in the integrated circuit.

In one embodiment of this invention, the method further includes the process of: (f) forming an inside base region of the transistor in the integrated circuit, wherein process (f) is performed after process (a).

In one embodiment of this invention, the local oxidization is applied to the light receiving regions of the plurality of split photodiodes and a light receiving region of the semiconductor layer of the first conductivity type. The antireflection film is provided for the light receiving regions of the plurality of split photodiodes. The antireflection film includes a first silicon oxidization film. The antireflection film further includes a silicon nitride film provided on the first silicon oxidization film. The method further includes the process of: (g) forming a second silicon oxidization film on the light receiving regions of the plurality of split photodiodes.

In one embodiment of this invention, process (c) includes the process of simultaneously forming the first silicon oxidization film and a through oxidization film, the through oxidization being used for forming the inside base region of the transistor.

In one embodiment of this invention, the first silicon oxidization film has a thickness of about 10 nm to about 40 nm.

In one embodiment of this invention, the antireflection film further includes a first silicon nitride film provided on the first silicon oxidization film. The method further includes the process of simultaneously forming the first silicon nitride film and a second silicon nitride film, the second silicon nitride film being provided on a silicon nitride film capacitor portion of the integrated circuit.

In one embodiment of this invention, the antireflection film further includes a silicon nitride film provided on the first silicon oxidization film. The method further includes the process of: (h) forming a second silicon oxidization film on the silicon nitride film, the second silicon oxidization film protecting the silicon nitride film.

In one embodiment of this invention, the method further includes the process of: (i) etching the second silicon oxidization film after all dry etching processes.

In one embodiment of this invention, the method further includes the process of: (i) etching a cover insulating film. Process (j) is performed after process (i).

In one embodiment of this invention, the semiconductor substrate includes a semiconductor of a first conductivity type having a high specific resistance.

In one embodiment of t his invention, the semiconductor substrate includes a semiconductor substrate of a first conductivity type having a low specific resistance; and an epitaxial layer of the first conductivity type having a high specific resistance, the epitaxial layer of the first conductivity type being provided on the semiconductor substrate of the first conductivity type.

Thus, the invention described herein makes possible the advantages of providing (1) a circuit-incorporating light receiving device in which a high-speed integrated circuit and a high-speed split photodiode are provided on a single substrate using the polycrystalline silicon emitter and the LOCOS isolation, and a fabrication method thereof; (2) a circuit-incorporating light receiving device having a satisfactory yield of transistors, and a fabrication method thereof; (3) a circuit-incorporating light receiving device having a narrow range of variations in transistor characteristics which are otherwise caused due to variations in the thickness of a through oxidization film, and a fabrication method thereof; (4) a circuit-incorporating light receiving device in which an antireflection film has a thickness optimally designed to lower a reflectance and variations in the reflectance are minimized, and a fabrication method thereof; and (5) a circuit-incorporating light receiving device having satisfactory cross-talk characteristics, and a fabrication method thereof.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described in detail.

EXAMPLE 1

Figure 1A:
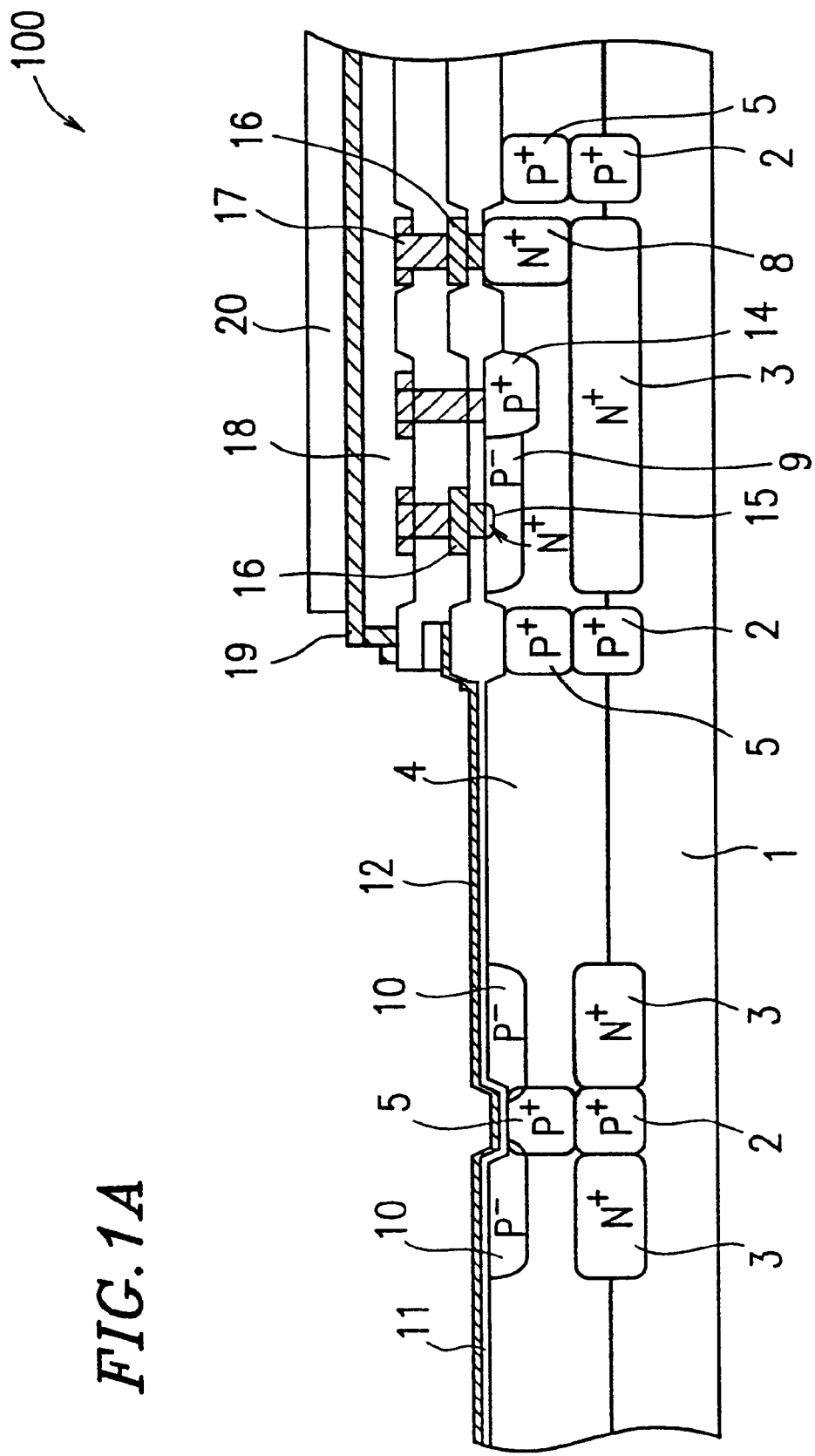
FIG. 1A is a cross-sectional view of a circuit-incorporating light receiving device (including a split photodiode and an NPN transistor) according to Example 1 of the present invention.

FIG. 1A shows a cross-sectional view of a circuit-incorporating light receiving device 100 according to Example 1 of the present invention. An emitter region 15 of an NPN transistor is formed using a polycrystalline silicon 16 which serves as a diffusion source and an electrode. To isolate elements on an integrated circuit portion from each other, local oxidization (also referred to as LOCOS) is carried out. A split photodiode is provided on the same silicon substrate on which the integrated circuit is provided. The split photodiode has a diffusion structure such that a response speed is enhanced and a radio-frequency noise is reduced. Specifically, a diffusion current component having a slow response is reduced, resulting in an increase in the response speed. The capacitance of the photodiode is also reduced (see FIG. 12 in Japanese Laid-Open Publication No. 10-107243).

An antireflection film is provided for reducing a leakage current at a surface of the above-described diffusion structure. To this end, a silicon thermal oxidization film 11 (about 26 nm thick) is formed on the surface of the diffusion structure, and a first silicon nitride film 12 (about 50 nm thick) is then formed on the silicon thermal oxidization film 11. The thickness of the antireflection film is designed to obtain a low reflectance with respect to actual laser light having a wavelength of about 780 nm or 650 nm.

Figure 1B:
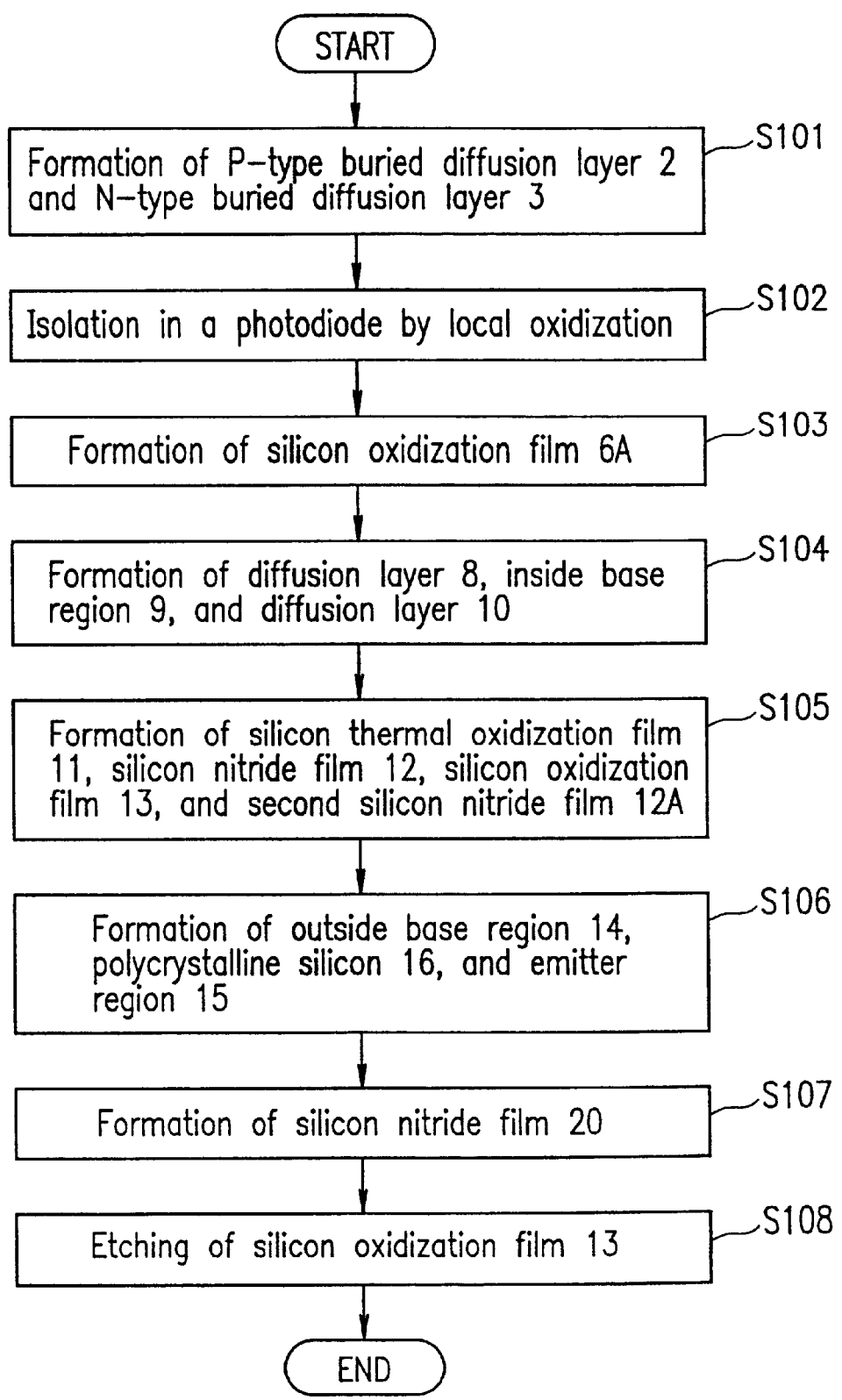
FIG. 1B is a flowchart illustrating a fabrication method of the circuit-incorporating light receiving device of Example 1.
Figure 2A:
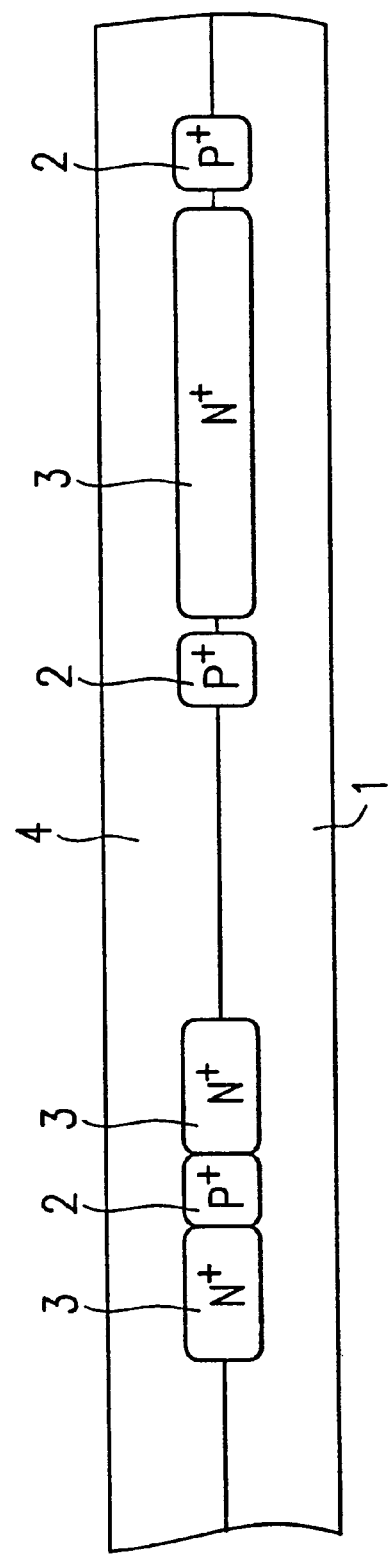
FIGS. 2A through 2H are diagrams for explaining the fabrication method of the circuit-incorporating light receiving device of Example 1.
Figure 11A:
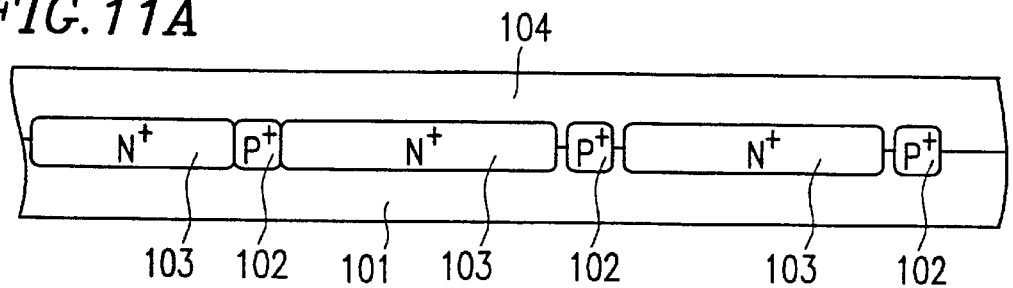
FIGS. 11A through 11H are diagrams illustrating a fabrication method of the conventional circuit-incorporating light receiving device.
Figure 11B:
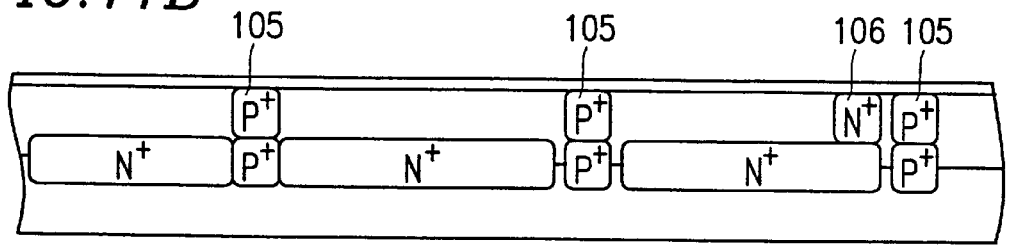
Figure 11C:
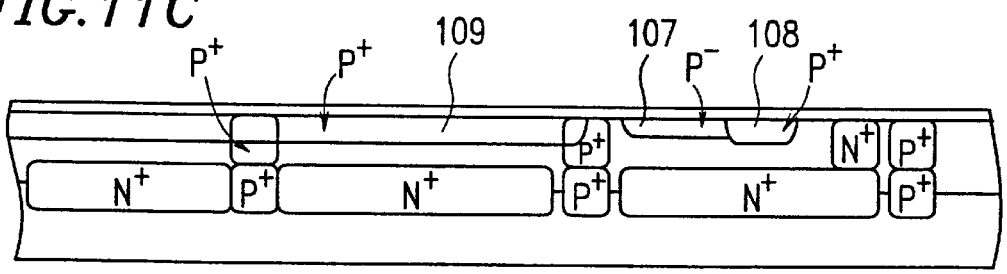
Figure 11D:
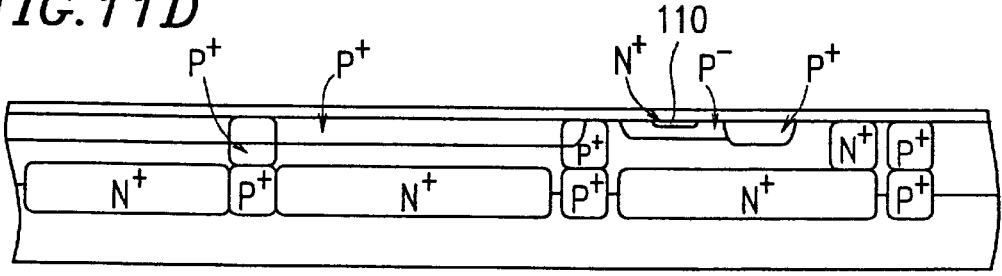
Figure 11E:
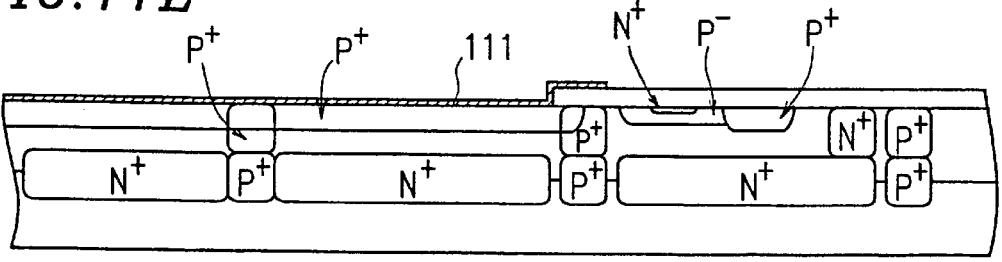
Figure 11F:
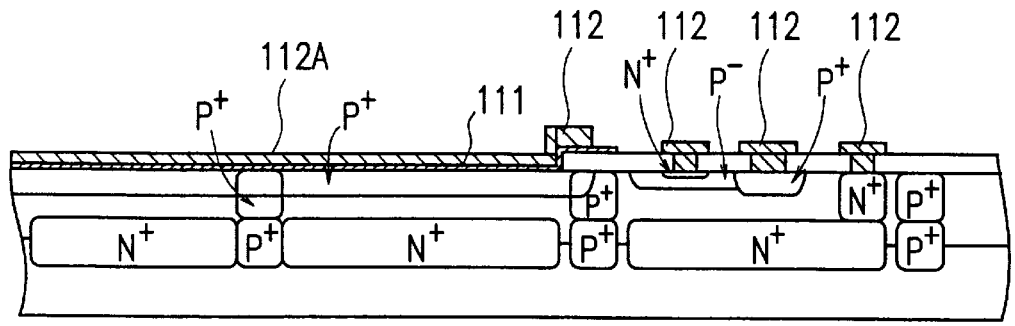
Figure 11G:
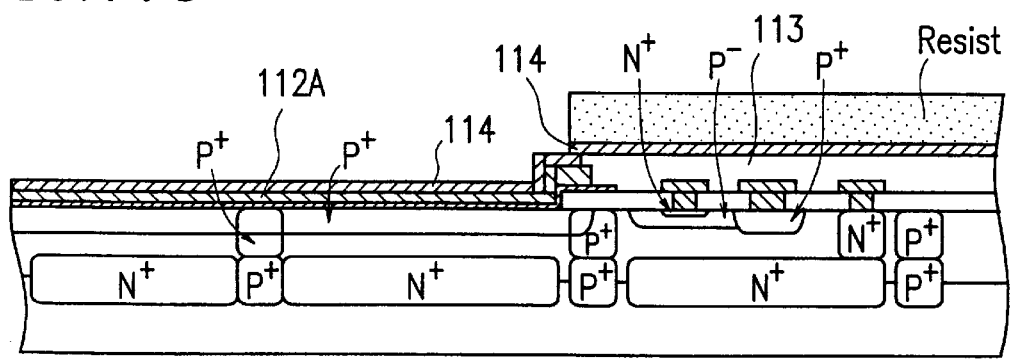
Figure 11H:
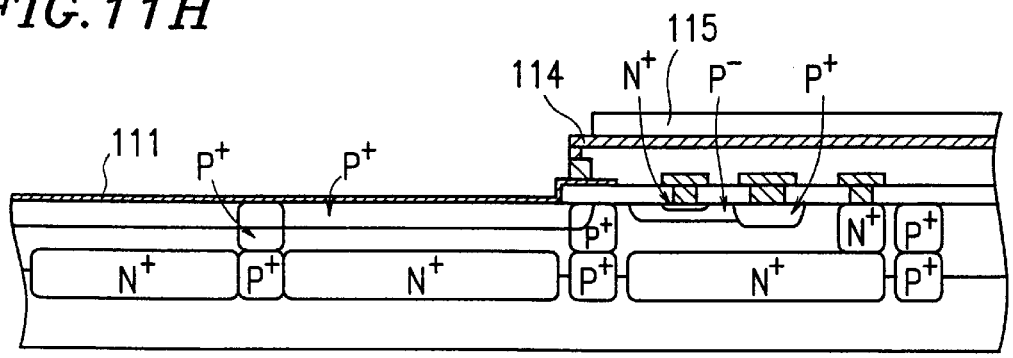

FIG. 11B is a flowchart illustrating a fabrication method of the circuit-incorporating light receiving device of Example 1. The fabrication method of circuit-incorporating light receiving device will be described with reference to FIG. 1B and FIGS. 2A–2H. As shown in FIG. 2A, on a P-type semiconductor substrate 1, a P-type buried diffusion layer 2 is formed in a region which is to be a isolating portion. An N-type buried diffusion layer 3 is formed in a split photodiode portion and an NPN transistor portion. Thereafter, an N-type epitaxial layer 4 is grown on the resultant substrate 1. As the P-type semiconductor substrate 1, a substrate having a high specific resistance (e.g., about 500 Ωcm) is used so as to reduce the capacitance of a photodiode. In this case, the N-type buried diffusion layer 3 is provided only in the vicinity of the P-type buried diffusion layer 2, thereby reducing a diffusion current component. The resultant structure leads to achievement of a high-speed photodiode (FIG. 1B, S101).

Figure 2B:
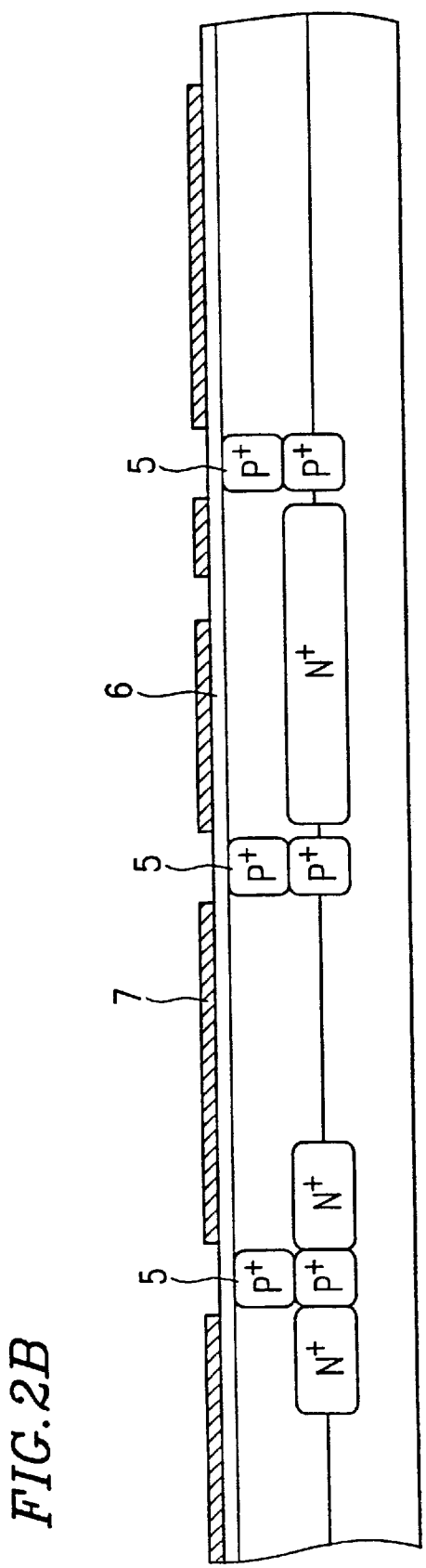

Next, as shown in FIG. 2B, a silicon oxidization film 6 is formed on the epitaxial layer 4. A silicon nitride film 7 is then formed on the silicon oxidization film 6. The silicon nitride film 7 decides a subsequent active region. Formation of a P-type isolating diffusion layer 5 is then carried out.

Figure 2C:
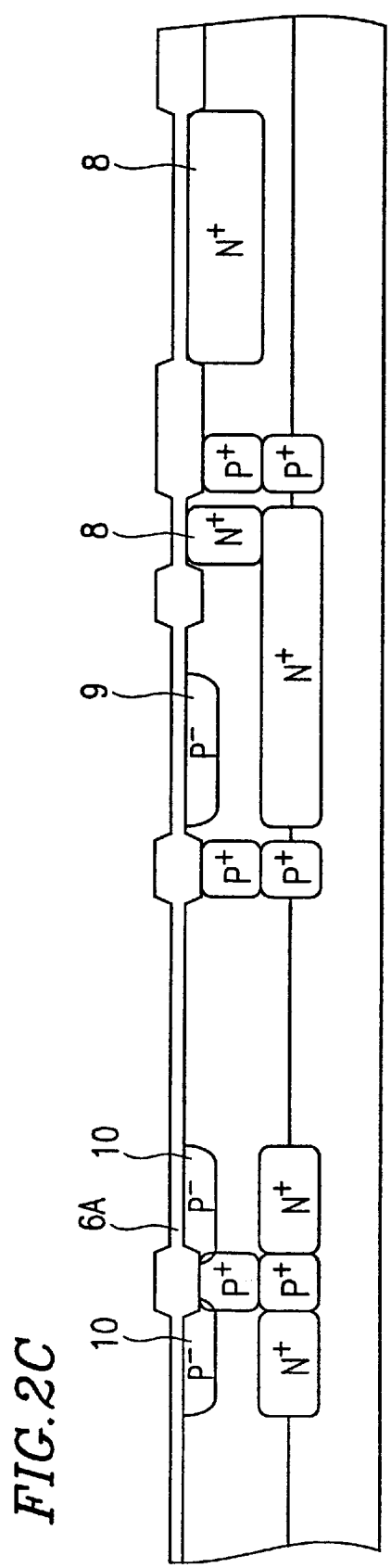

Next, referring to FIG. 2C, the local oxidization (LOCOS) is carried out. The silicon oxidization film 6 which has not been oxidized by the local oxidization is etched (S102). Finally, a silicon oxidization film 6A (several tens of nanometers thick) is additionally provided so as to obtain a through oxidization film having the intended thickness (S103). A base region (not shown) of the Vertical-PNP transistor, and a collector compensation diffusion layer 8 and an inside base region 9 of the NPN transistor are formed by ion implantation through the silicon oxidization film 6A. In this case, a P-type diffusion layer 10 of the split photodiode is formed at the same time when the inside base region 9 of the NPN transistor is formed (S104).

Figure 2D:
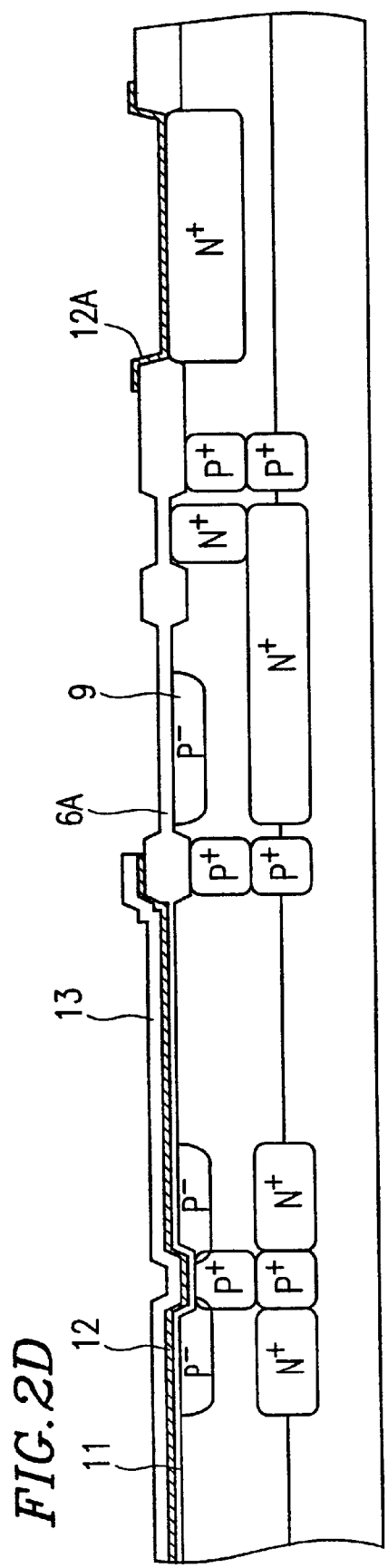

Next, as shown in FIG. 2D, the silicon thermal oxidization film 11 (about 26 nm thick) and the first silicon nitride film 12 (about 50 nm thick), which serve as an antireflection film of the split photodiode, are provided. A silicon oxidization film 13 is formed on the antireflection film by CVD or the like so as to prevent a reduction in the antireflection film which would otherwise be caused by etching for forming a conductor. The use of the silicon thermal oxidization film 11 as the antireflection film allows formation of the photodiode diffusion structure shown in FIG. 12. Moreover, the reflectance of the photodiode can be reduced by use of the silicon nitride film 12 provided on the silicon thermal oxidization film 11. A second silicon nitride film 12A is formed at a silicon nitride film capacitor portion in the integrated circuit (S105).

Figure 3A:
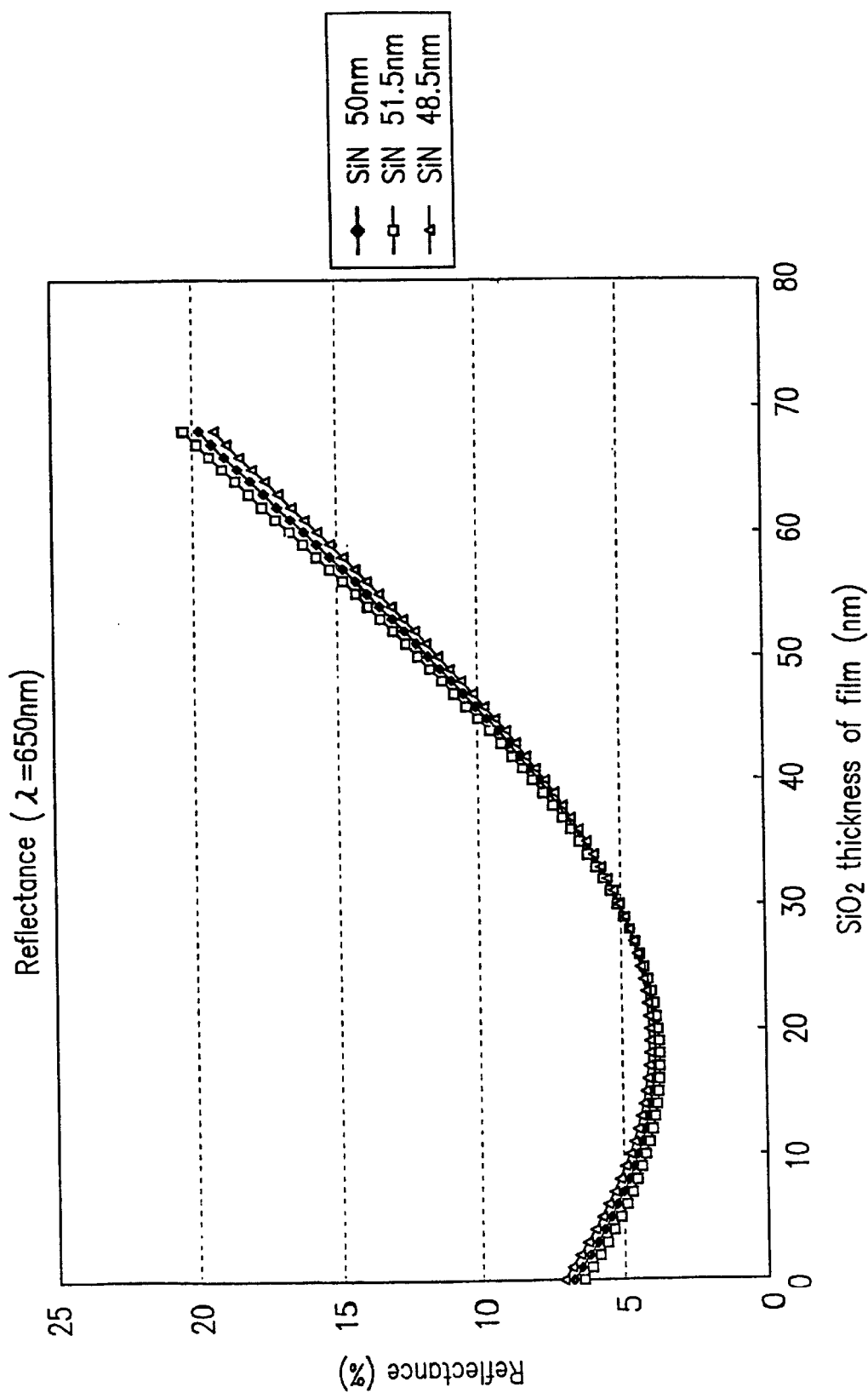
FIG. 3A is a graph showing a result of calculation of a reflectance of $SiO_2$ with respect to wavelength $\lambda$=650 nm.
Figure 3B:
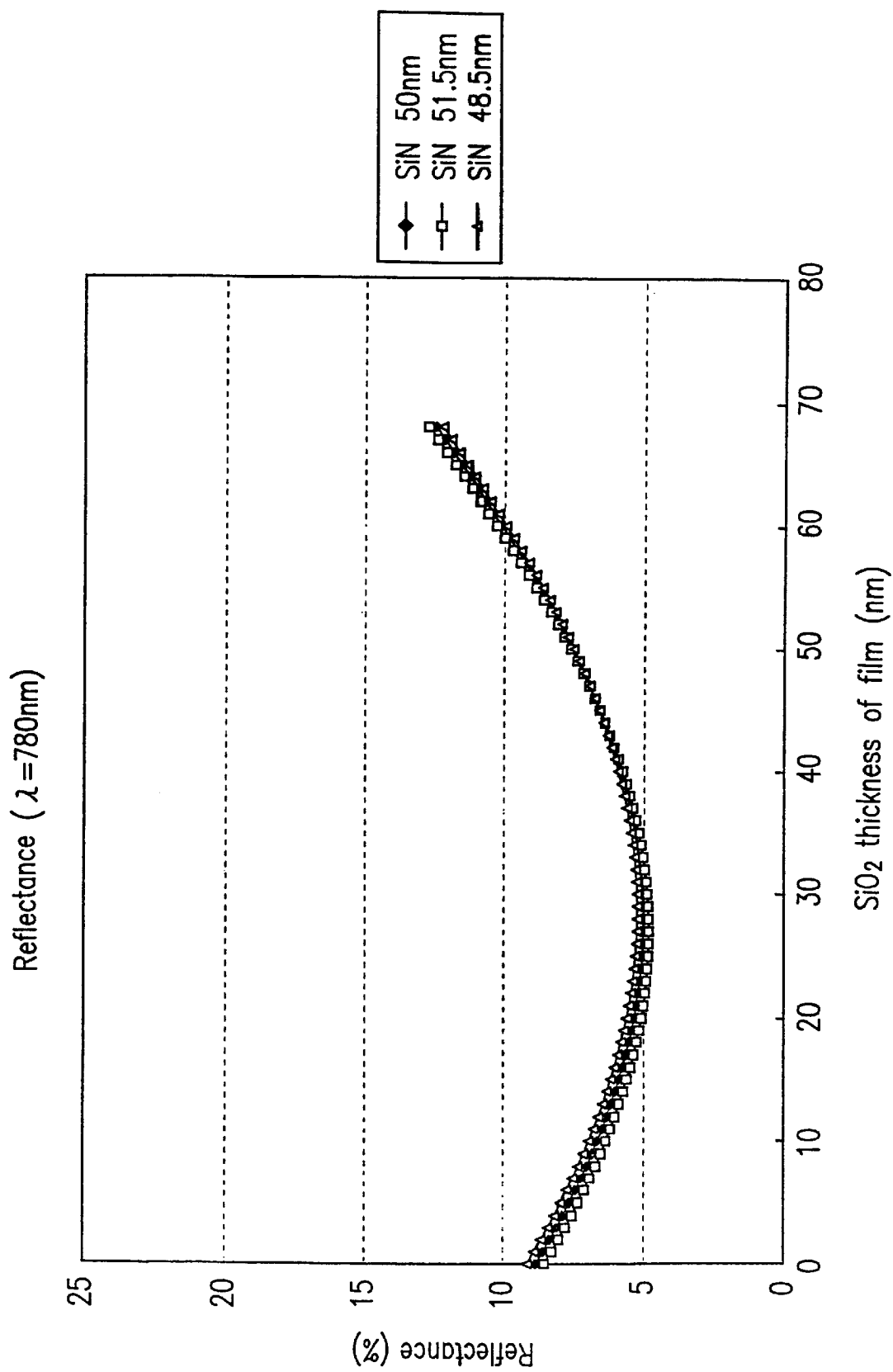
FIG. 3B is a graph showing a result of calculation of a reflectance of $SiO_2$ with respect to wavelength $\lambda$=780 nm.

The above-described films are designed to have a thickness such that the reflectance becomes the lowest with respect to semiconductor laser light having a wavelength of about 650 nm or about 780 nm which is used for a typical optical pickup (see FIGS. 3A and 3B). As is understood from FIGS. 3A and 3B, when the silicon thermal oxidization film 11 has a thickness of about 10 nm to about 40 nm, the reflectance can be about 7% or less.

The antireflection film (silicon thermal oxidization film 11) of the split photodiode is formed after the inside base region 9 of the NPN transistor is provided. For this reason, the silicon oxidization film 6A which serves as the through oxidization film does not suffer from variations in the thickness thereof which would otherwise be caused by the preprocess or etching carried out in the formation of the antireflection film. Further, variations in the transistor characteristics are not increased. The first and second silicon nitride films 12 and 12A are simultaneously formed, thereby avoiding an increase in manufacturing cost.

Figure 2E:
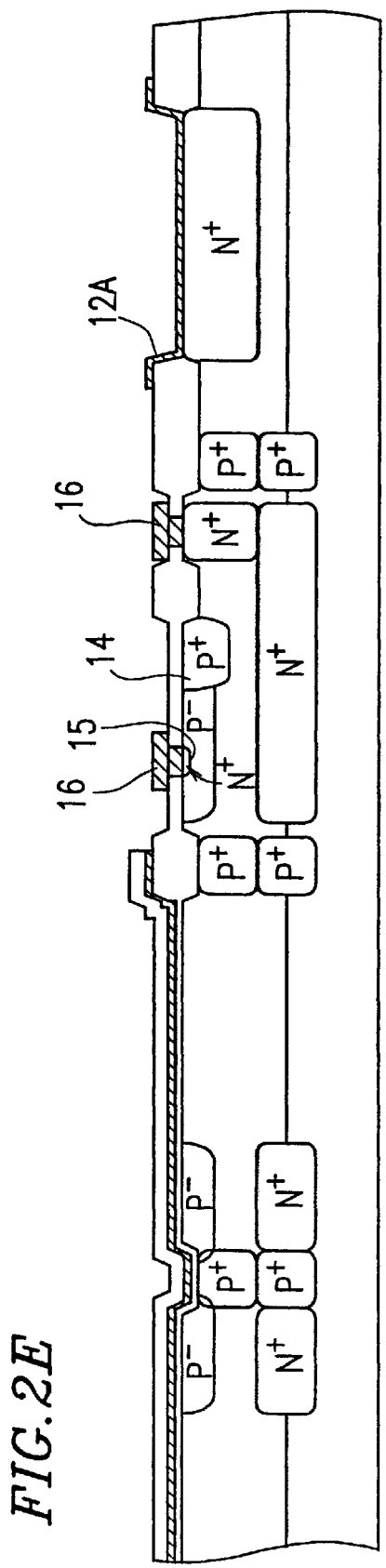

Further, as shown in FIG. 2E, an emitter region (not shown) of the V-PNP transistor, and an outside base region 14 and a polycrystalline silicon 16 of the NPN transistor are provided. The polycrystalline silicon 16 serves as a diffusion source and an electrode for formation of an emitter region 15. The emitter region 15 is formed by implanting arsenic ions into the polycrystalline silicon 16 and annealing (S106). The antireflection film is provided before the formation of the emitter region 15, thereby preventing a reduction in yield of transistors.

Figure 2F:
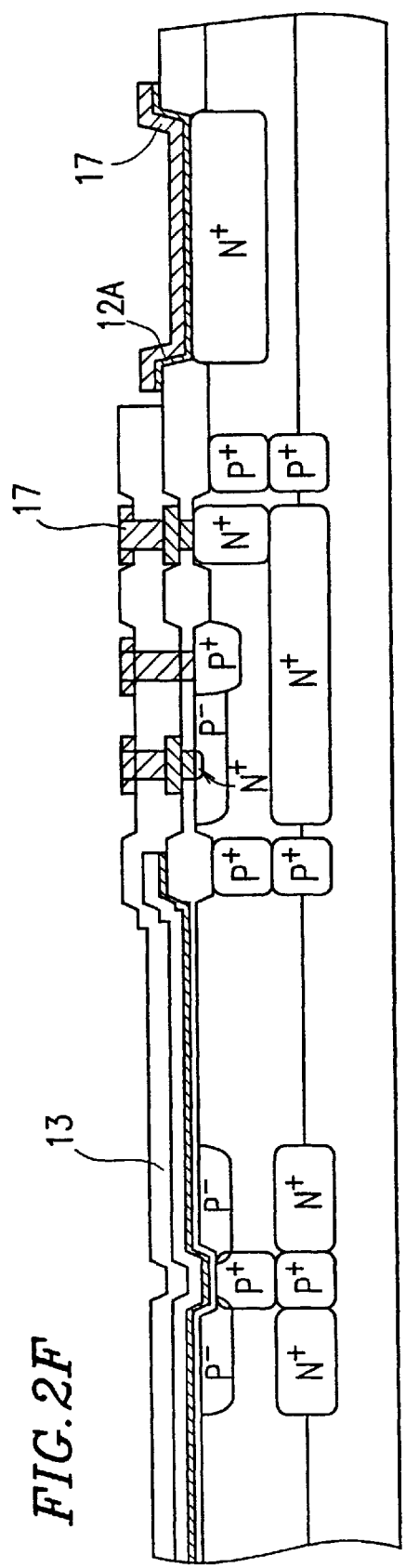

Next, as shown in FIG. 2F, a first layer conductor 17 is patterned after a contact hole is provided and a conductive material such as AlSi is provided on the entire surface of the resultant structure. As etching for the first layer conductor 17, dry etching is carried out for etching barrier metal (TiW) and reducing the width of the conductor 17. In this case, a silicon oxidization film 13 (formed by CVD or the like) is provided for protecting the antireflection film provided on the split photodiode. For this reason, the antireflection film is not reduced in dry etching, so that the thickness of the antireflection film can be retained at the optimal value. Moreover, the antireflection film is not damaged by plasma, thereby preventing degradation of leakage current characteristics of the photodiode.

Figure 2G:
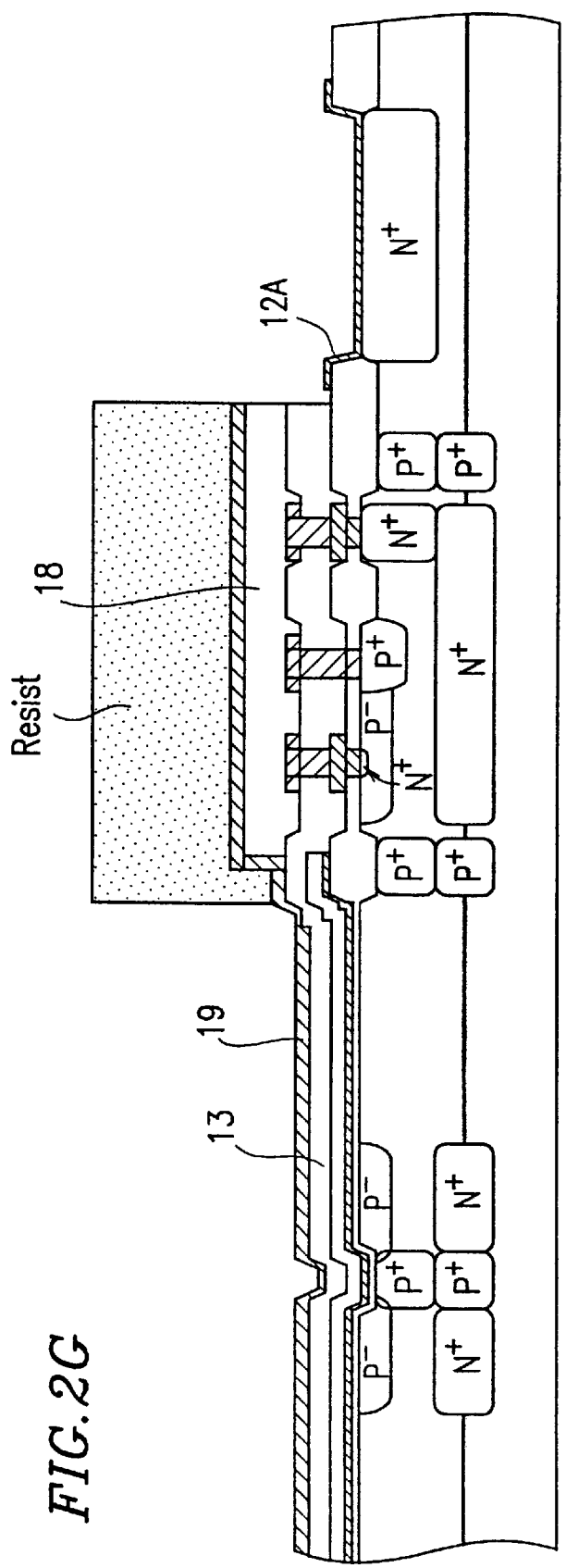

Next, as shown in FIG. 2G, an interlayer insulating film 18 is provided and a second layer conductor 19 is then provided. These films are formed by dry etching. Also in this case, the silicon oxidization film 13 (formed by CVD or the like) is provided for protecting the antireflection film provided on the split photodiode. For this reason, the antireflection film is not reduced in dry etching, so that the thickness of the antireflection film can be retained at the optimal value. Moreover, the antireflection film is not damaged by plasma, thereby preventing degradation of leakage current characteristics of the photodiode.

Figure 2H:
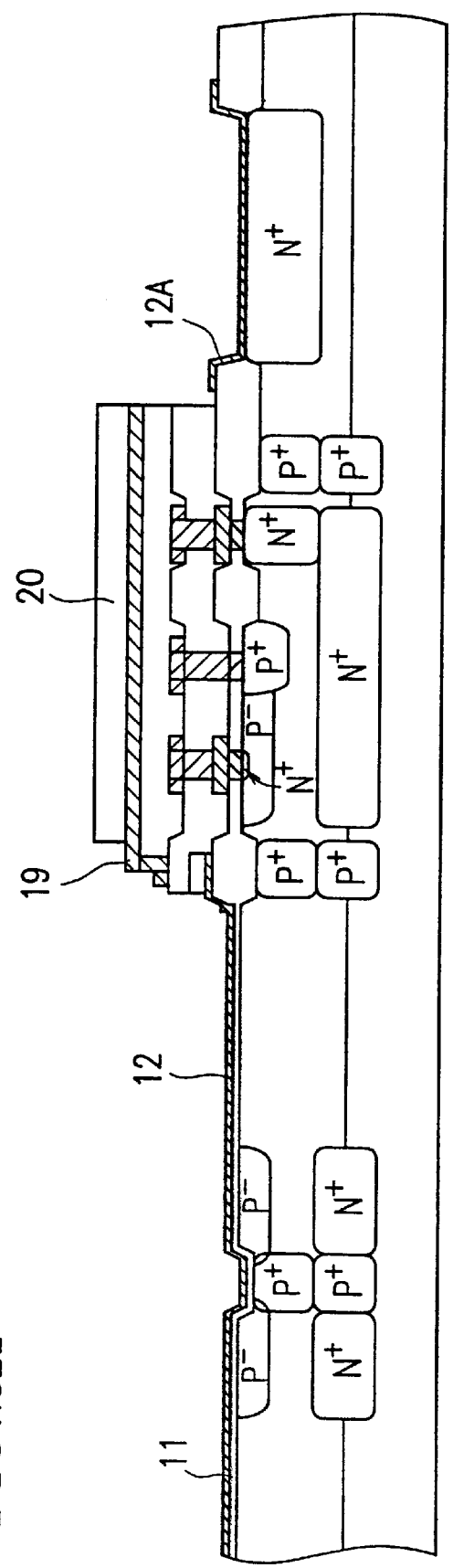

FIG. 2H shows the circuit-incorporating light receiving device of Example 1 which is completed. After the second layer conductor 19 is provided, a silicon nitride film 20 serving as a cover insulating film is formed on the second layer conductor 19 (S107). Finally, using the patterned silicon nitride film 20 as a protection film, the silicon oxidization film 13 which has been used for protection against the previous etching is subjected to wet etching (S108). This eliminates a photolithographic process, thereby reducing manufacturing cost. Moreover, the silicon-oxidization film 13 for protection is removed after all the dry etching processes are finished, whereby the antireflection film can be protected from all the dry etching.

According to the above-described fabrication method, the silicon thermal oxidization film 11 and the silicon nitride film 12 which serve as the antireflection film of the split photodiode can be provided without variations in transistor characteristics. Moreover, a conductor having a small width can be provided by dry etching so that the scale of the integrated circuit can be improved while the photosensitivity of the split photodiode is not reduced and the leakage current characteristics thereof are not degraded.

A substrate having a high specific resistance is preferable so as to reduce the capacitance of a photodiode. When the specific resistance of a substrate is too high, the series resistance of a photodiode becomes high and the response speed of the photodiode is decreased in accordance with the CR time constant. Accordingly, to obtain a higher-speed photodiode, a P-type epitaxial layer having a high specific resistance (e.g., about 1000 Ωcm) may be provided on a P-type substrate having a low specific resistance (e.g., about 4 Ωcm), whereby the series resistance of the photodiode can be reduced without an increase in the photodiode capacitance.

EXAMPLE 2

Figure 4A:
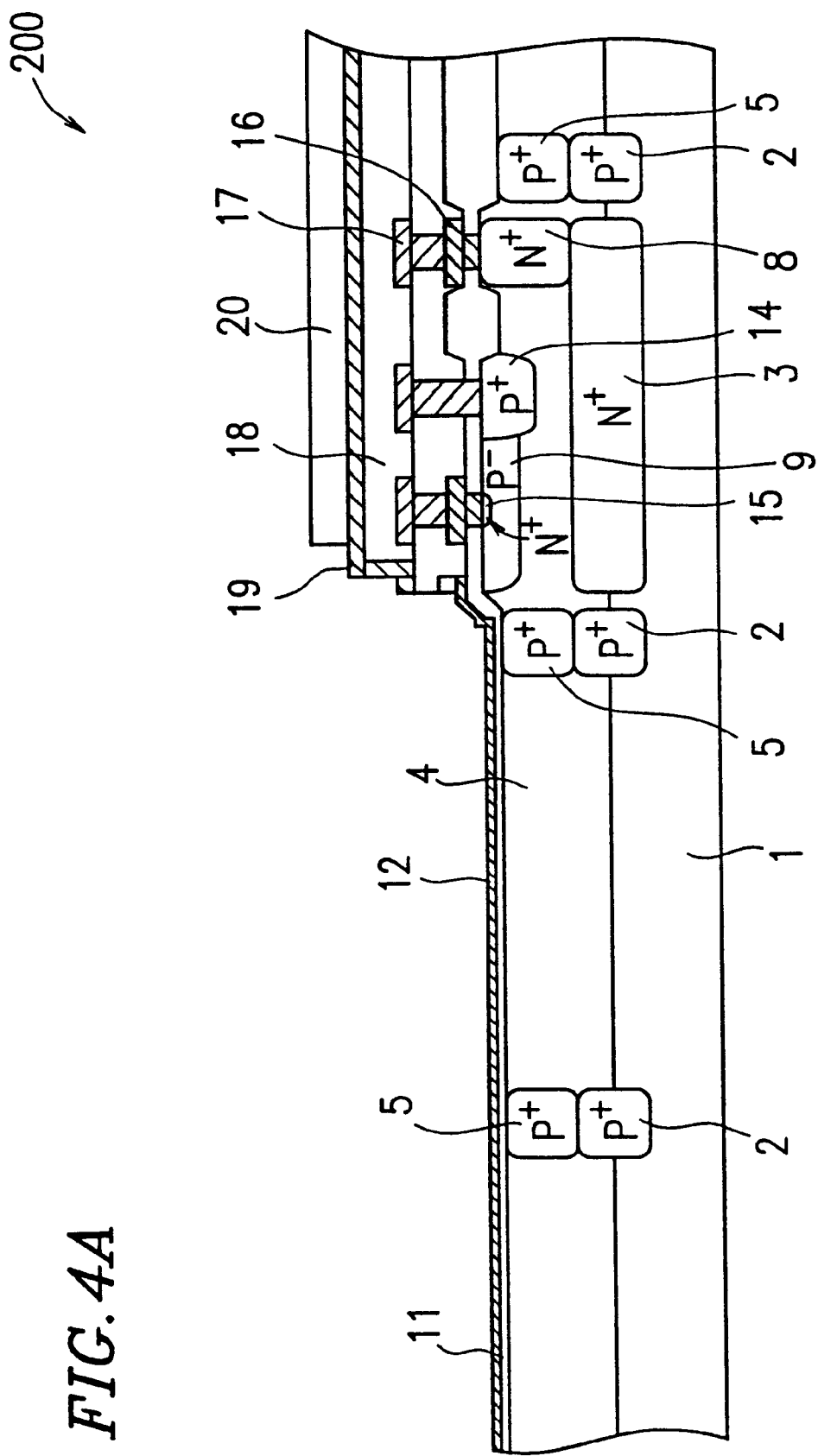
FIG. 4A is a cross-sectional view of a circuit-incorporating light receiving device (including a split photodiode and an NPN transistor) according to Example 2 of the present invention.
Figure 4B:
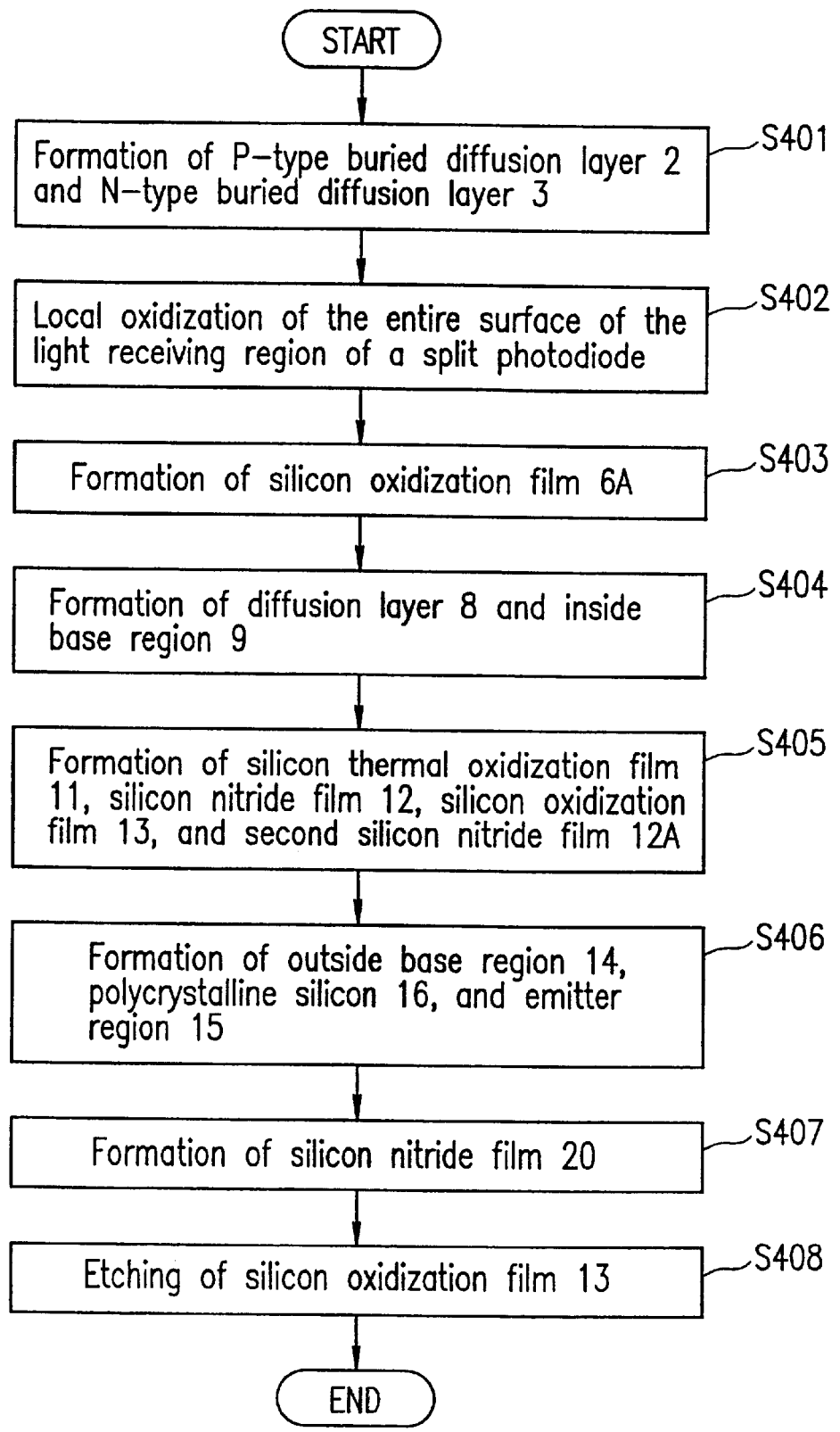
FIG. 4B is a flowchart illustrating a fabrication method of the circuit-incorporating light receiving device of Example 2.

FIG. 4A is a cross-sectional view of a circuit-incorporating light receiving device 200 according to Example 2 of the present invention. A fabrication method of the circuit-incorporating light receiving device 200 is characterized in that the local oxidization (LOCOS) for the isolation in the integrated circuit portion does not generate a LOCOS process in the splitting portion of the split photodiode which is generated in Example 1. For this reason, there is substantially no degradation of cross-talk characteristics. FIG. 4B is a flowchart of a fabrication method of the circuit-incorporating light receiving device 200. The fabrication method will be described with reference to FIG. 4B and FIGS. 5A through 5D.

Figure 5A:
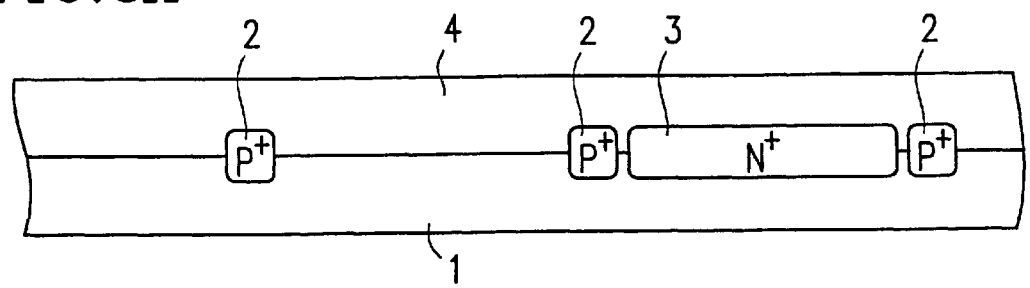
FIGS. 5A through 5D are diagrams for explaining the fabrication method of the circuit-incorporating light receiving device of Example 2.

Referring to FIG. 5A, on a P-type semiconductor substrate 1, a P-type buried diffusion layer 2 is formed in a region which is to be a isolating portion. An N-type buried diffusion layer 3 is formed in an NPN transistor portion. Thereafter, an N-type epitaxial layer 4 is grown on the resultant substrate 1 (FIG. 4B, S401). As the P-type semiconductor substrate 1, a substrate having a high specific resistance (e.g., about 500 Ωcm) is used for the same purpose as described in Example 1.

Figure 5B:
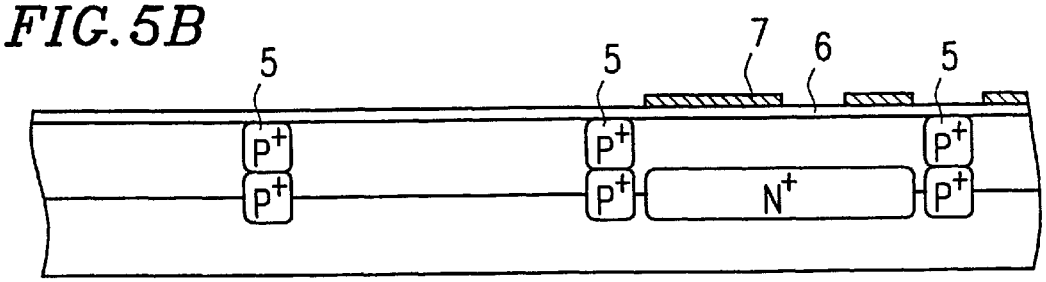
Figure 5C:
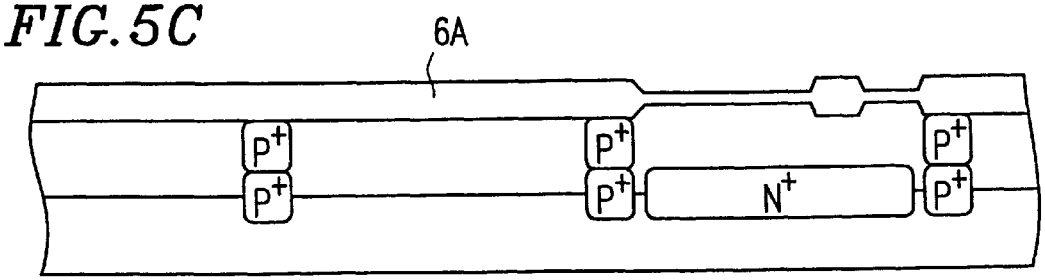

Next, as shown in FIG. 5B, a silicon oxidization film 6 is formed on the epitaxial layer 4. A silicon nitride film 7 is then formed on the silicon oxidization film 6. The silicon nitride film 7 decides a subsequent active region. Formation of a P-type isolating diffusion layer 5 is then carried out in the following way which is similar to that described in Example 1. Boron ions are implanted into a region which is to be the isolation diffusion layer 5. The boron ions are further pushed downward by local oxidization (LOCOS).

As is different from Example 1, the local oxidization is carried out on the entire surface of a light receiving region of the split photodiode (see FIG. 5C) so as not to generate a LOCOS process in the splitting portion (S402). This leads to prevention of the degradation of the cross-talk characteristics which would be caused by a LOCOS process otherwise generated in the splitting portion. Similar to Example 1, local oxidization for the integrated circuit portion is carried out and the silicon nitride film 7 is removed, followed by formation of a silicon oxidization film 6A having the intended thickness.

Figure 5D:
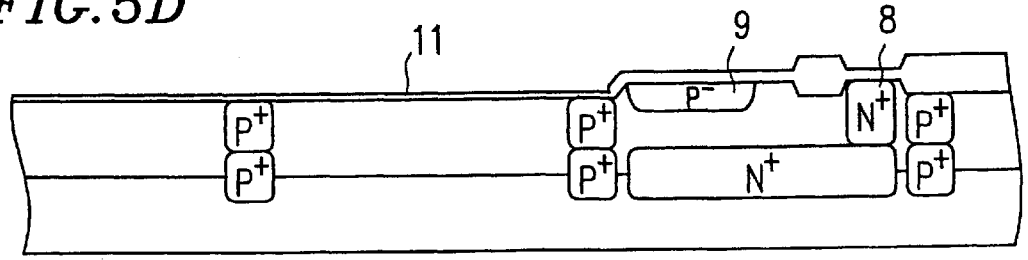

Next, as shown in FIG. 5D, a collector compensation diffusion layer 8 and an inside base region 9 of the NPN transistor are formed by ion implantation (S404). A P-type diffusion layer 10 of the photodiode, which is simultaneously provided along with the inside base region in Example 1, cannot be provided since the thick local oxidization film covers the surface of the light receiving region. Thereafter, a silicon thermal oxidization film 11 serving as an antireflection film is formed on the split photodiode. Similar to Example 1, the silicon oxidization film 11 is provided after the formation of the inside base region, so that variations in the thickness of the through oxidization film can be prevented.

The subsequent processes are similar to those described in Example 1, so that the corresponding figures are omitted. A silicon nitride film 12 and a silicon oxidization film 13 (formed by CVD or the like) are provided. The silicon nitride film 12 serves as an antireflection film. The silicon oxidization film 13 prevents the antireflection film from being reduced due to etching for forming a conductor, and the like. The silicon nitride film 12 is simultaneously formed along with a second silicon nitride film 12A in a nitride film capacitance portion, thereby avoiding an increase in manufacturing cost (S405).

Next, an emitter region of the V-PNP transistor, and an outside base region 14 and a polycrystalline silicon 16 of the NPN transistor are provided. The polycrystalline silicon 16 serves as a diffusion source and an electrode. Arsenic ions are implanted into the polycrystalline silicon 16 which is then subjected to annealing to form the emitter region 15 (S406). Thereafter, a contact hole is provided. A conductive material such as AlSi is formed on the entire surface of the resultant structure, followed by patterning to obtain a first layer conductor 17. A silicon nitride film 20 as a cover insulating film is provided after formation of an interlayer insulating film 18 and a second layer conductor 19 (S407). Finally, the silicon oxidization film 13, which has been formed by CVD or the like for protection against dry etching, is wet etched using the patterned silicon nitride film 20 as a protection film.

As described above in Example 2, in addition to the advantages of Example 1, the degradation of the cross-talk characteristics, which would be caused by the LOCOS process otherwise generated in the splitting portion of the split photodiode, can be prevented. Moreover, also in Example 2, to obtain a higher-speed photodiode, a P-type epitaxial layer having a high specific resistance (e.g., about 1000 Ωcm) may be provided on a P-type substrate having a low specific resistance (e.g., about 4 Ωcm), whereby the series resistance of the photodiode can be reduced without an increase in the photodiode capacitance.

EXAMPLE 3

Figure 6A:
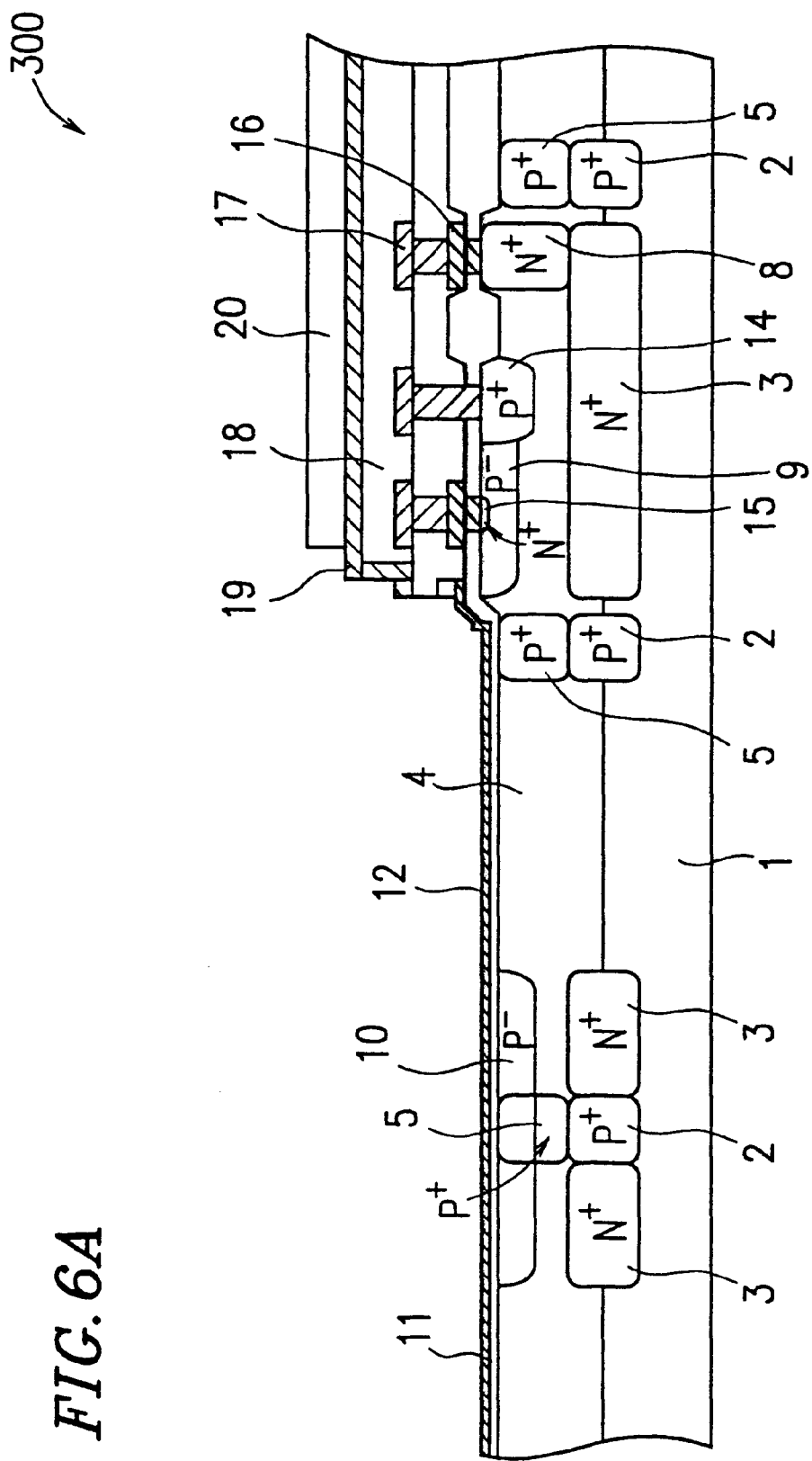
FIG. 6A is a cross-sectional view of a circuit-incorporating light receiving device (including a split photodiode and an NPN transistor) according to Example 3 of the present invention.
Figure 6B:
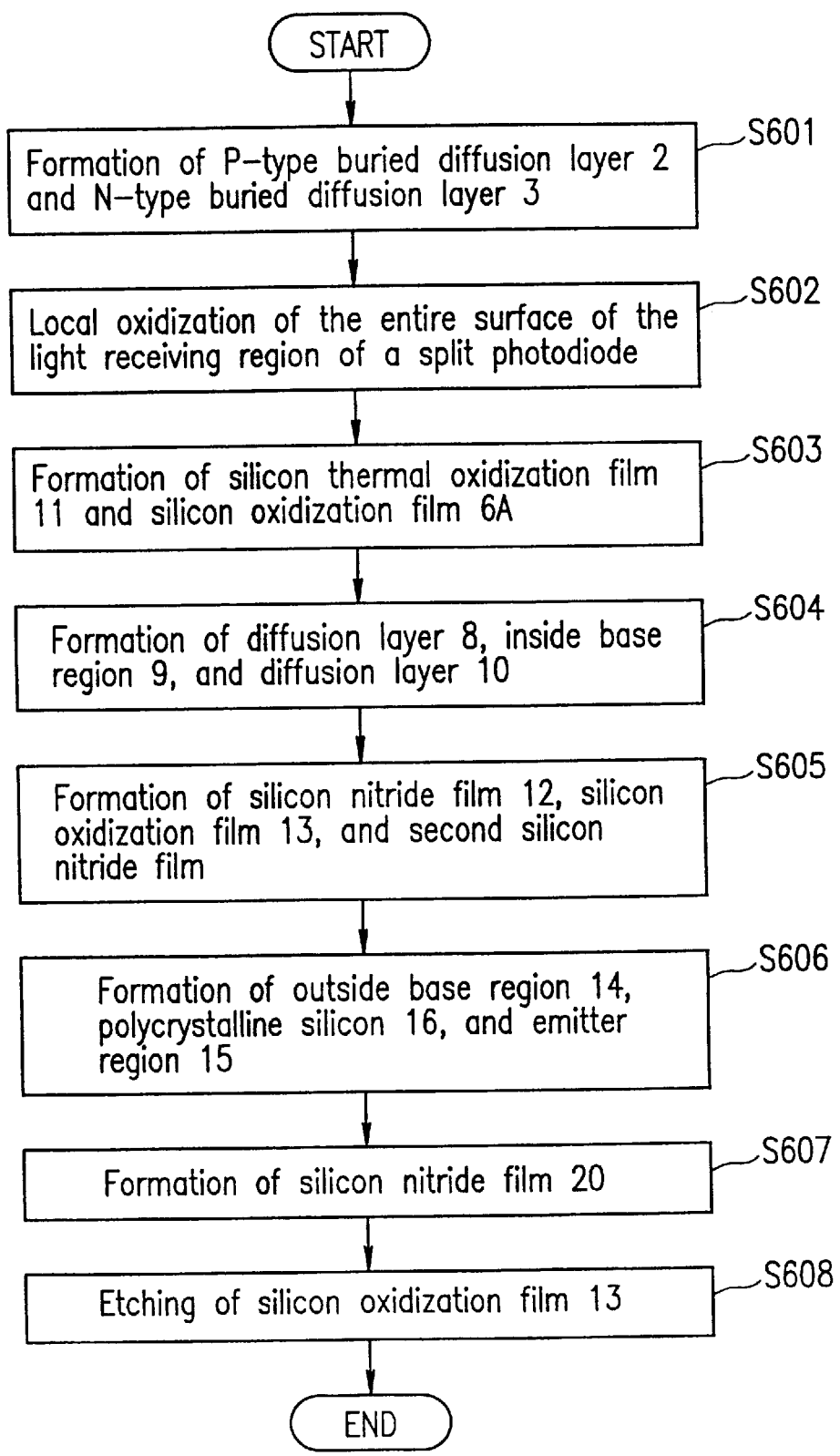
FIG. 6B is a flowchart illustrating a fabrication method of the circuit-incorporating light receiving device of Example 3.

FIG. 6 is a cross-sectional view of a circuit-incorporating light receiving device 300 according to Example 3 of the present invention. In the device 300 of Example 3, similar to Example 2, a LOCOS process is not generated in the splitting portion of the split photodiode. In addition, the P-type diffusion layer 10 required to improve the response of the photodiode can be provided. Such a P-type diffusion layer 10 is not available in Example 2. FIG. 6B is a flowchart of a fabrication method of the circuit-incorporating light receiving device 300. The fabrication method thereof will be described below with reference to FIG. 6B and FIGS. 7A through 7C.

Similar to Example 1, on a P-type semiconductor substrate 1, a P-type buried diffusion layer 2, an N-type buried diffusion layer 3 are formed. An N-type epitaxial layer 4 is grown on the resultant structure. Similar to Examples 1 and 2, the P-type semiconductor substrate 1 has a specific resistance of about 500 Ωcm.

Next, similar to Examples 1 and 2, a silicon oxidization film 6 (not shown) and a silicon nitride film 7 (not shown) are provided. A P-type isolating diffusion layer 5 is then provided. Thereafter, similar to Example 2, local oxidization is carried out on the entire surface of the light receiving region of a split photodiode in such a manner that a LOCOS process is not generated in a splitting portion. This leads to prevention of the degradation of the cross-talk characteristics which would be caused by a LOCOS process otherwise generated in the splitting portion (S602).

Figure 7A:
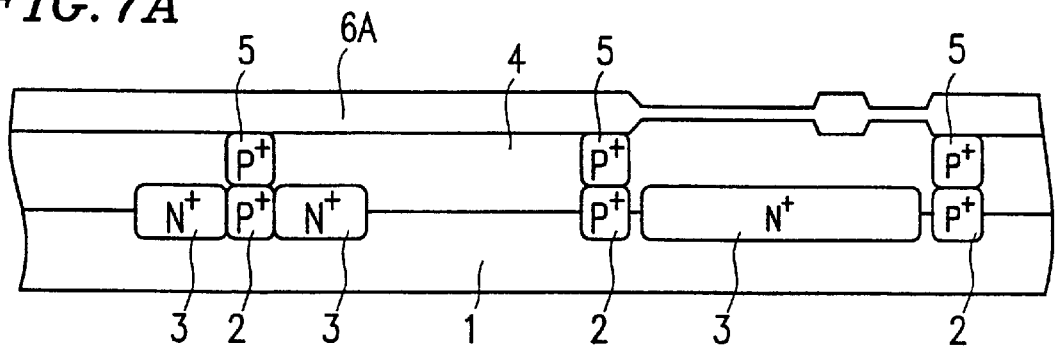
FIGS. 7A through 7C are diagrams for explaining the fabrication method of the circuit-incorporating light receiving device of Example 3.

Next, the silicon nitride film 7 is removed by local oxidization (see FIG. 7A). A local oxidization film in the light receiving region of the photodiode is etched. Only a silicon thermal oxidization film 11 serving as an antireflection film is provided. This is because if a silicon nitride film 12 is provided on the silicon thermal oxidization film 11, a P-type diffusion layer 10 of the split photodiode cannot simultaneously be provided along with an inside base region 9 of the NPN transistor. In this case, a silicon oxidization film 6A having the intended thickness is simultaneously provided (S603). This eliminates the need for formation of a through oxidization film and thus reduces the processes, thereby reducing manufacturing cost.

Figure 7B:
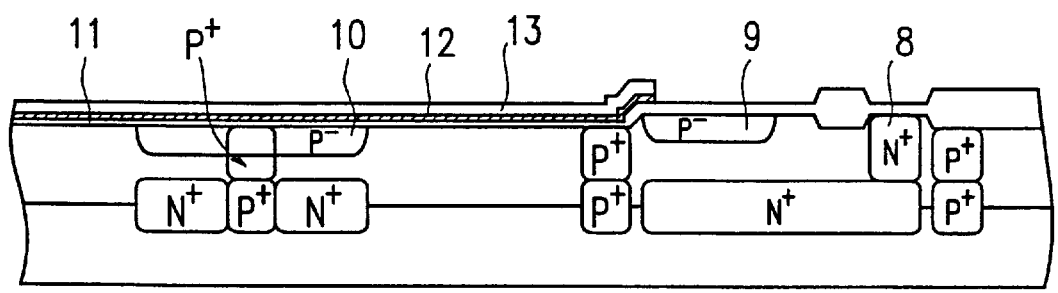

Next, as shown in FIG. 7B, a collector compensation diffusion layer 8 and an inside base region 9 of the NPN transistor, and a P-type diffusion layer 10 of the split photodiode are formed by ion implantation. Further, a silicon nitride film 12 and a silicon oxidization film 13 are provided. The silicon nitride film 12 serves as an antireflection film of the split photodiode. The silicon oxidation film 13 is formed by CVD or the like so as to prevent the antireflection films from being reduced due to etching for forming a conductor. The silicon nitride film 12 is simultaneously formed along with a second silicon nitride film (not shown) in a nitride film capacitor portion, whereby manufacturing cost is not increased (S605).

Figure 7C:
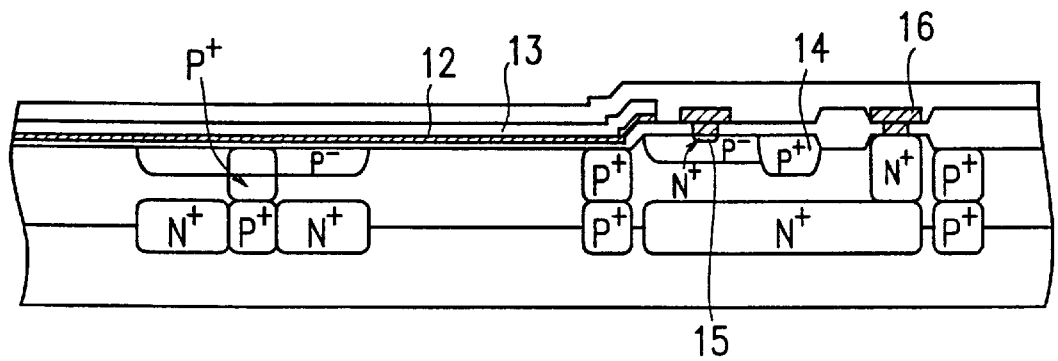

Next, as shown in FIG. 7C, an emitter region (not shown) of the V-PNP transistor, and an outside base region 14 and a polycrystalline silicon 16 of the NPN transistor are provided. The polycrystalline silicon 16 serves as a diffusion source and an electrode. Arsenic ions are implanted into the polycrystalline silicon 16 which is then subjected to annealing, thereby forming an emitter region 15 (S606). Also in Example 3, the antireflection film is provided before the formation of the emitter region, whereby a yield of transistors is not reduced.

As the following process is similar to that described in Examples 1 and 2, the corresponding figures are omitted. A contact hole is thereafter provided. A conductive material such as AlSi is formed on the entire surface of the resultant structure, followed by patterning to obtain a first layer conductor 17. This patterning requires dry etching for a reduced width of a conductor. In this case, the silicon oxidization film 13 is formed by CVD or the like on the antireflection film provided on the split photodiode. Since the silicon oxidization film 13 protects the antireflection film so that the silicon nitride film 12 is not etched by the dry etching. Therefore, the silicon nitride film having the optimized thickness is not reduced. There is substantially no damage due to plasma in dry etching. The degradation of the leakage current characteristics in the photodiode is prevented. A silicon nitride film 20 as a cover insulating film is provided after formation of an interlayer insulating film 18 and a second layer conductor 19 (S607). Finally, the silicon oxidization film 13, which has been formed by CVD or the like for protection against dry etching, is wet etched using the patterned silicon nitride film 20 as a protection film (S608).

Figure 12:
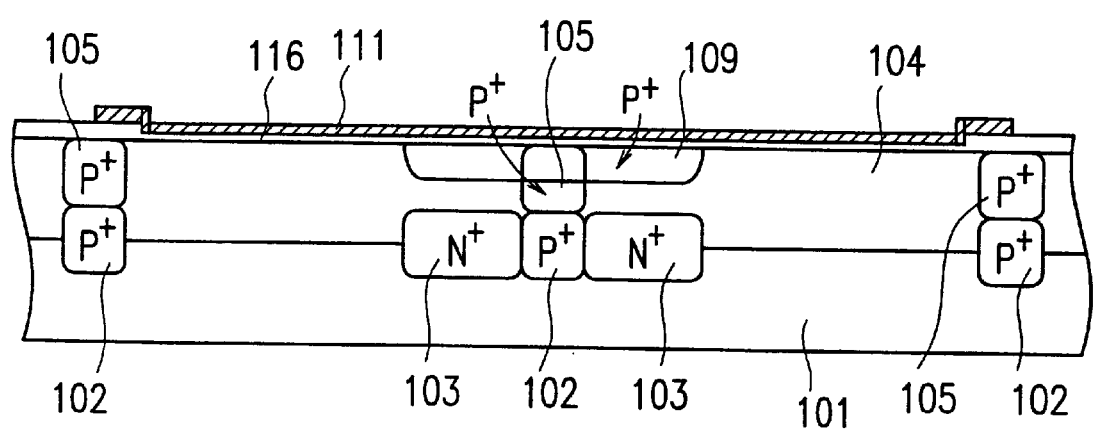
FIG. 12 is a diagram for explaining a diffusion structure in which a junction capacitance is reduced while retaining a response speed.
Figure 13A:
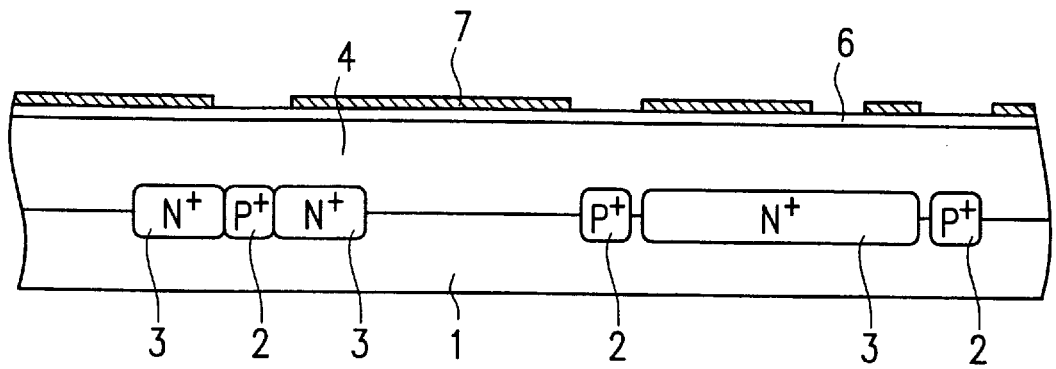
FIGS. 13A through 13C are diagrams illustrating a conventional process of forming a isolating diffusion region and an active region.
Figure 13B:
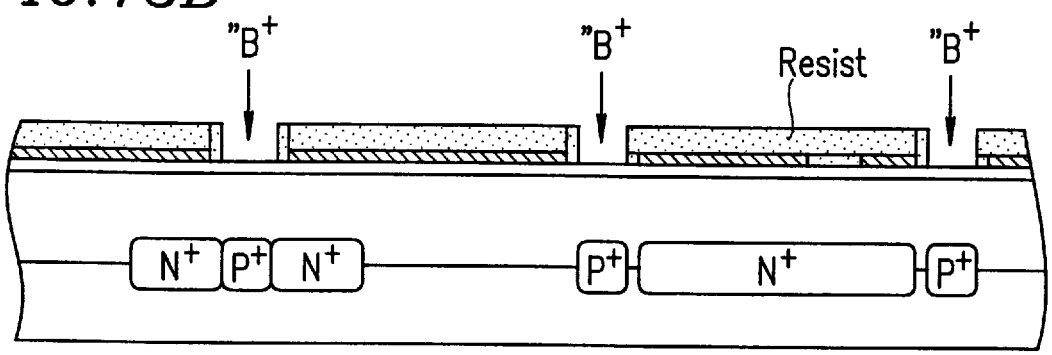
Figure 13C:
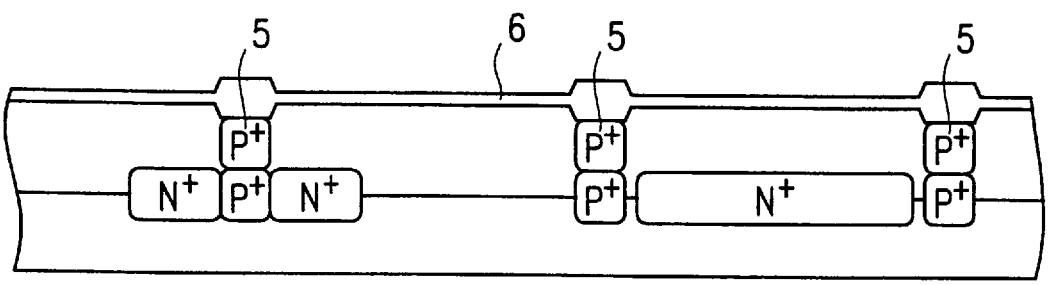
Figure 14:
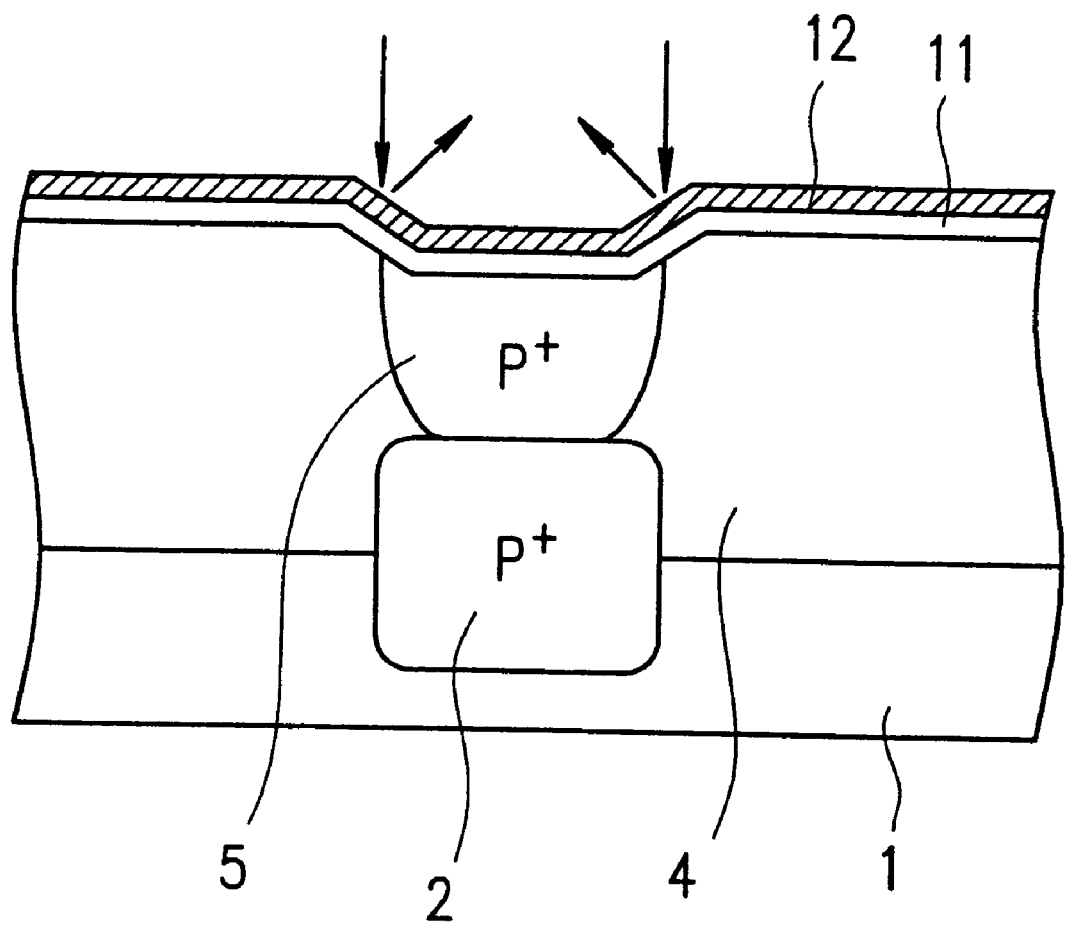
FIG. 14 is a diagram for explaining degradation of cross-talk characteristics due to a LOCOS process in a photodiode splitting portion.

As described above in Example 3, in addition to the advantages of Examples 1 and 2, it is possible to use the structure shown in FIG. 12 in which a high-speed split photodiode can be obtained. Moreover, also in Example 3, to obtain a higher-speed photodiode, a P-type epitaxial layer having a high specific resistance (e.g., about 1000 Ωcm) may be provided on a P-type substrate having a low specific resistance (e.g., about 4 Ωcm), whereby the series resistance of the photodiode can be reduced without an increase in the photodiode capacitance.

EXAMPLE 4

Figure 8A:
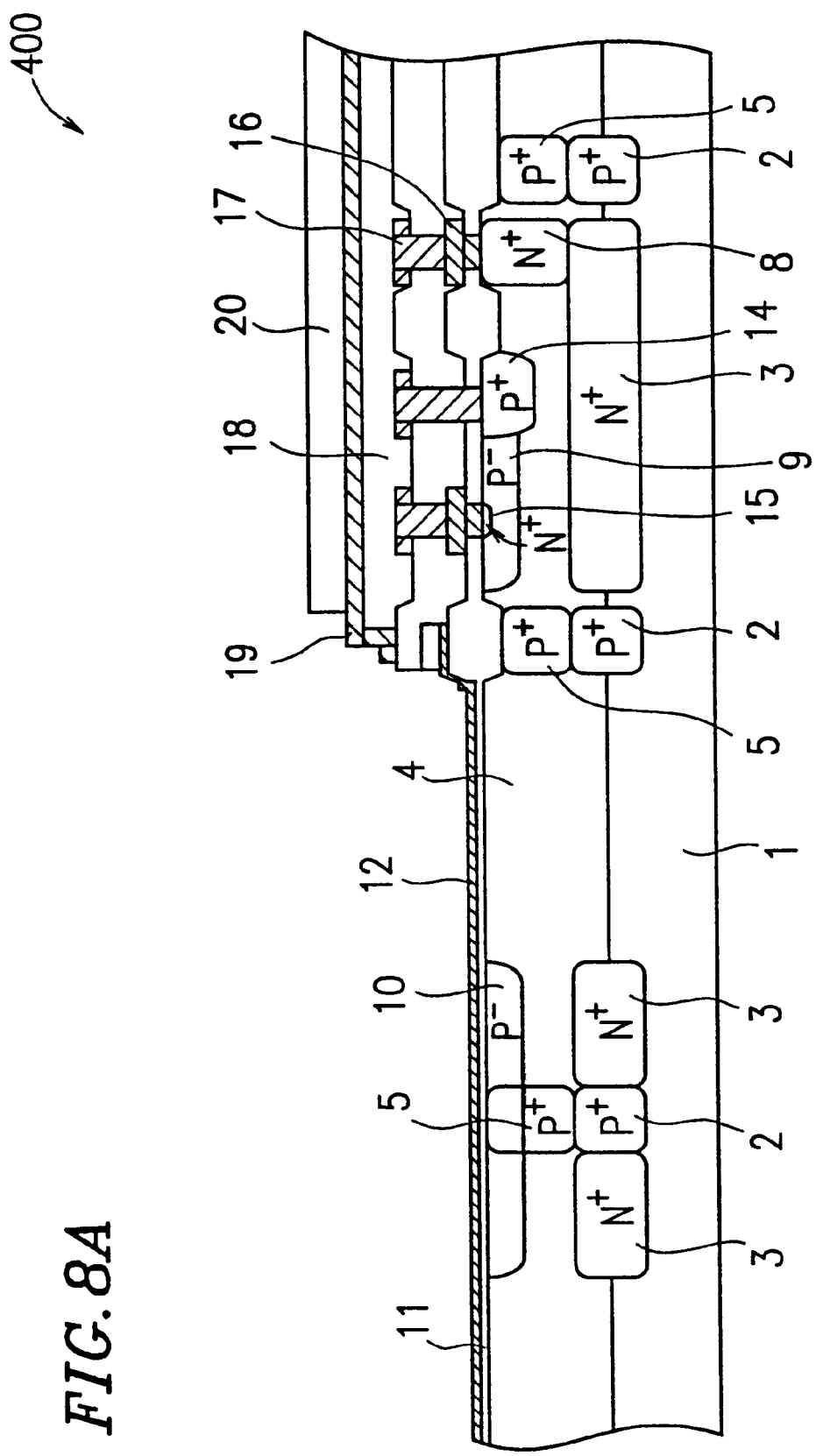
FIG. 8A is a cross-sectional view of a circuit-incorporating light receiving device (including a split photodiode and an NPN transistor) according to Example 4 of the present invention.
Figure 8B:
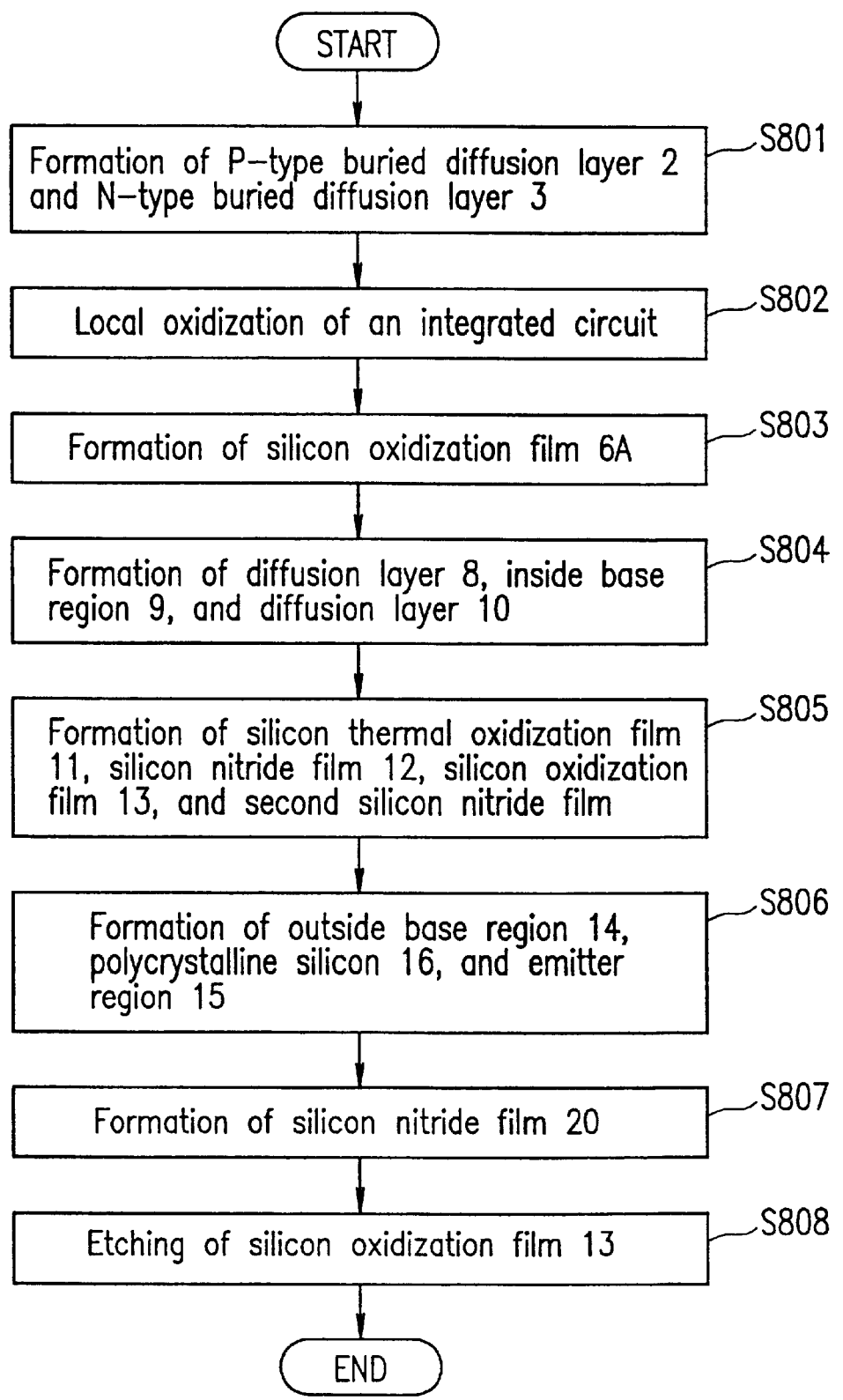
FIG. 8B is a flowchart illustrating a fabrication method of the circuit-incorporating light receiving device of Example 4.

FIG. 8A is a cross-sectional view of a circuit-incorporating light receiving device 400 according to Example 4 of the present invention. A fabrication method of the circuit-incorporating light receiving device 400 is characterized in that the local oxidization (LOCOS) for the isolation in the integrated circuit portion does not generate a LOCOS process in the splitting portion of the split photodiode which is generated in Example 1. For this reason, there is substantially no degradation of cross-talk characteristics. As is different from Examples 2 and 3, substantially no local oxidization is carried out on the entire light receiving region including a splitting portion of the photodiode. FIG. 8B is a flowchart of a fabrication method of the circuit-incorporating light receiving device 400. The fabrication method will be described with reference to FIG. 8B and FIGS. 9A through 9C.

Figure 9A:
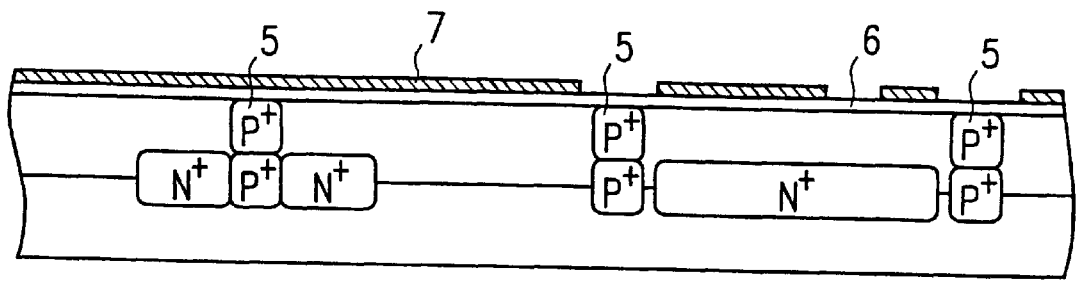
FIGS. 9A through 9C are diagrams for explaining the fabrication method of the circuit-incorporating light receiving device of Example 4.

Just as in Examples 1 through 3, a P-type buried diffusion layer 2, an N-type buried diffusion layer 3 are provided, and an N-type epitaxial layer 4 is grown (S801). In Example 4, the order of processes for forming a P-type isolating diffusion layre 5 is different from those in Examples 1 through 3. Specifically, as shown in FIG. 9A, a silicon oxidization film 6 is provided. After the P-type isolating diffusion layer 5 is provided, a silicon nitride film 7 which determines an active region is provided. As is different from Examples 1 through 3, the P-type isolating diffusion layer 5 is provided before the formation of the silicon nitride film 7. Accordingly, substantially no local oxidization is carried out on the entire light receiving region including the splitting portion of the split photodiode when the silicon nitride film 7 which decides the active region is formed after boron ion implantation for forming the P-type isolating diffusion layer 5. When using the same order of processes as described in Examples 1 through 3, the P-type isolating diffusion layer 5 is not formed in a region which is covered with the silicon nitride film 7, i.e., the photodiode cannot be split. Accordingly, a LOCOS process is not generated in the splitting portion, so that the degradation of the cross-talk characteristics in the split photodiode is prevented.

Figure 9B:
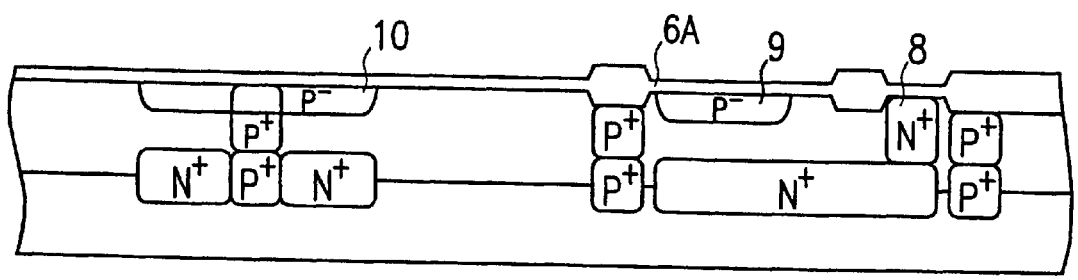

Next, as shown in FIG. 9B, the silicon nitride film 7 is removed after local oxidization (S802). To obtain a through oxidized film having the intended thickness, a portion which has not been oxidized by the local oxidization is etched and a silicon oxidization film 6A is formed as the through oxidization film (S803).

Next, a collector compensation diffusion layer 8 and an inside base region 9 of the NPN transistor, and a P-type diffusion layer 10 of the split photodiode are formed by ion implantation (S804). The inside base region 9 of the NPN transistor and the P-type diffusion layer 10 of the split photodiode are simultaneously provided.

Figure 9C:
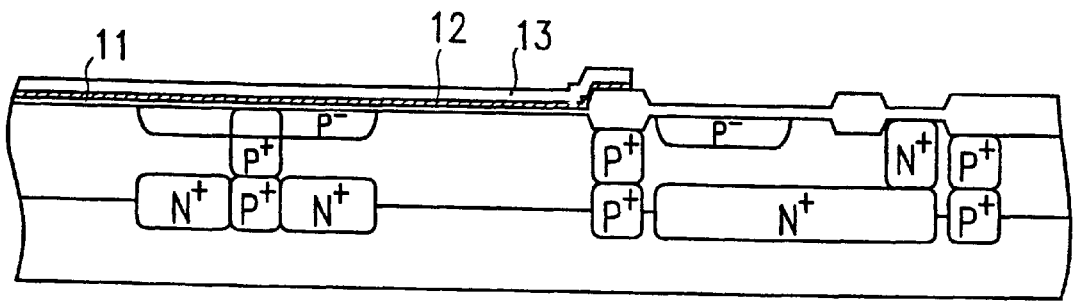
Figure 10:
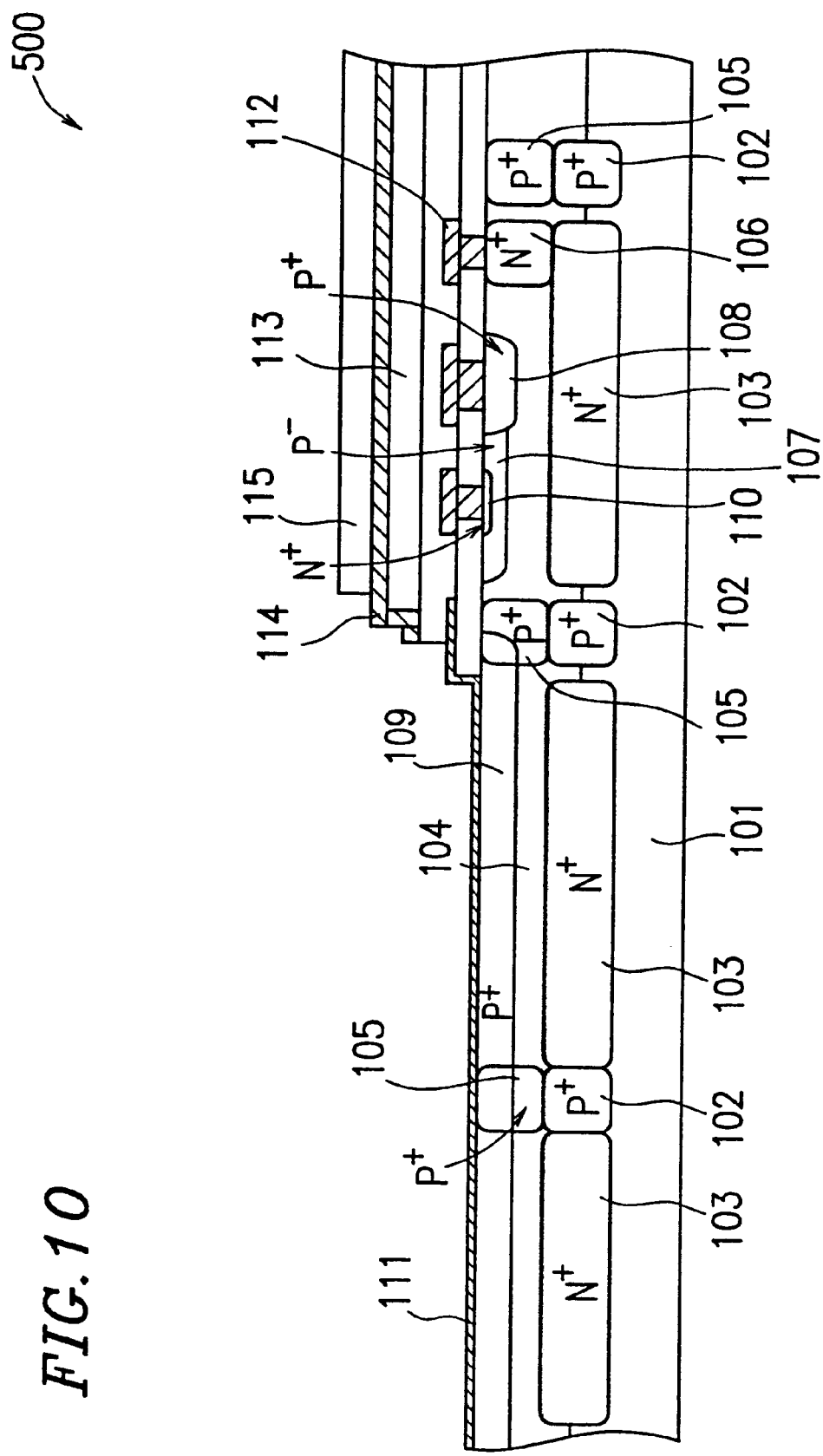
FIG. 10 is a cross-sectional view of a conventional circuit-incorporating light receiving device.

Similar to Examples 1 through 3, a silicon thermal oxidization film 11, a silicon nitride film 12, and a silicon oxidization film 13 are provided (see FIG. 9C, S805). The silicon thermal oxidization film 11 and the silicon nitride film 12 serve as an antireflection film of the split photodiode. The silicon oxidization film 13 is formed by CVD or the like for protection of the antireflection film. The silicon nitride film 12 is simultaneously formed along with a second silicon nitride film of a nitride film capacitor portion, whereby an increase in manufacturing cost is prevented.

As the following process is similar to that described in Example 1, the corresponding figures are omitted. Next, an emitter region (not shown) of the V-PNP transistor, and an outside base region 14 and a polycrystalline silicon 16 of the NPN transistor are provided. The polycrystalline silicon 16 serves as a diffusion source and an electrode. Arsenic ions are implanted into the polycrystalline silicon 16 which is then subjected to annealing, thereby forming an emitter region 15 (S806). The antireflection film is provided before the formation of the emitter region 15, whereby a yield of transistors is not reduced.

Thereafter, a contact hole is provided. A conductive material such as AlSi is formed on the entire surface of the resultant structure, followed by patterning to obtain a first layer conductor 17. This patterning requires dry etching for a reduced width of a conductor. The silicon oxidization film 13 is formed by CVD or the like on the antireflection film provided on the split photodiode. Since the silicon oxidization film 13 protects the antireflection film so that the silicon nitride film 12 is not etched by the dry etching. Therefore, the silicon nitride film having the optimized thickness is not reduced. There is substantially no damage due to plasma in dry etching. The degradation of the leakage current characteristics in the photodiode is prevented.

A silicon nitride film 20 as a cover insulating film is provided after formation of an interlayer insulating film 18 and a second layer conductor 19 (S807). Finally, the silicon oxidization film 13, which has been formed by CVD or the like for protection against the dry etching for forming the first layer conductor 17, is wet etched using the patterned silicon nitride film 20 as a protection film (S808).

As described above in Example 4, in addition to the advantages of Example 1, similar to Examples 2 and 3, a LOCOS process is not generated in the splitting portion, so that the degradation of the cross-talk characteristics in the split photodiode is prevented.

Also in Example 4, to obtain a higher-speed photodiode, a P-type epitaxial layer having a high specific resistance (e.g., about 1000 Ωcm) may be provided on a P-type substrate having a low specific resistance (e.g., about 4 Ωcm), whereby the series resistance of the photodiode can be reduced without an increase in the photodiode capacitance.

As described above, the present invention can provide a circuit-incorporating light receiving device in which a high-speed integrated circuit and a high-speed split photodiode are provided on a single substrate using the polycrystalline silicon emitter and the LOCOS isolation, and a fabrication method thereof.

Further, the present invention can provide a circuit-incorporating light receiving device having a satisfactory yield of transistors, and a fabrication method thereof.

Further, the present invention can provide a circuit-incorporating light receiving device having a narrow range of variations in transistor characteristics which are caused due to variations in the thickness of a through oxidization film, and a fabrication method thereof.

Further, the present invention can provide a circuit-incorporating light receiving device in which an antireflection film has a narrow range of variations in the reflectance, and a fabrication method thereof.

Further, the present invention can provide a circuit-incorporating light receiving device having satisfactory cross-talk characteristics, and a fabrication method thereof.

In the fabrication method of the circuit-incorporating light receiving device of the present invention, a polycrystalline silicon is used as a diffusion source and an electrode for emitter formation. A high-speed integrated circuit can be provided using LOCOS isolation as element isolation. Such a high-speed integrated circuit and a split photodiode are allowed to be provided on a single silicon substrate while retaining response characteristics, photosensitivity characteristics, cross-talk characteristics, leakage current characteristics, and the like of the split photodiode. It is thus possible to provide a circuit-integrating light receiving device having high-speed response capability, high sensitivity, and less noise.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A circuit-incorporating light receiving device comprising a transistor and a photodiode, wherein the transistor and the photodiode are provided on a single semiconductor substrate;

the transistor comprises a polycrystalline silicon as an emitter diffusion source and an electrode; and elements included in the transistor are isolated from each other using local oxidization into an epitaxial layer.

2. A circuit-incorporating light receiving device according to claim 1, wherein the semiconductor substrate comprises a semiconductor substrate of a first conductivity type;

the photodiode comprises a first semiconductor layer of a second conductivity type provided on the semiconductor substrate of the first conductivity type and a semiconductor layer of the first conductivity type splitting the first semiconductor layer of the second conductivity type into a plurality of semiconductor layers of the second conductivity type;

the photodiode comprises a plurality of split photodiodes for detecting a light signal using the first semiconductor layer of the second conductivity type and the semiconductor substrate of the first conductivity type; and light receiving regions of the plurality of split photodiodes and a surface of the semiconductor layer of the first conductivity type are subjected to local oxidization.

3. A circuit-incorporating light receiving device according to claim 1, wherein the semiconductor substrate comprises a semiconductor substrate of a first conductivity type;

the photodiode comprises a first semiconductor layer of a second conductivity type provided on the semiconductor substrate of the first conductivity type and a semiconductor layer of the first conductivity type splitting the first semiconductor layer of the second conductivity type into a plurality of semiconductor layers of the second conductivity type;

the photodiode comprises a plurality of split photodiodes for detecting a light signal using the first semiconductor layer of the second conductivity type and the semiconductor layer of the first conductivity type; and light receiving regions of the plurality of split photodiodes and a surface of the semiconductor layer of the first conductivity type are not subjected to local oxidization.

4. A circuit-incorporating light receiving device according to claim 1, wherein an antireflection film is provided on a light receiving region of the photodiode; and the antireflection film comprises a silicon oxidization film.

5. A circuit-incorporating light receiving device according to claim 4, wherein the antireflection film further comprises a silicon nitride film provided on the silicon oxidization film.

6. A circuit-incorporating light receiving device according to claim 1, wherein the semiconductor substrate comprises a semiconductor of a first conductivity type having a high specific resistance.

7. A circuit-incorporating light receiving device according to claim 1, wherein the semiconductor substrate comprises a semiconductor substrate of a first conductivity type having a low specific resistance; and an epitaxial layer of the first conductivity type having a high specific resistance, the epitaxial layer of the first conductivity type being provided on the semiconductor substrate of the first conductivity type.

8. A circuit-incorporating light receiving device comprising a transistor and a photodiode, wherein the transistor and the photodiode are provided on an epitaxial layer above a single semiconductor substrate;

the transistor having a polycrystalline silicon as an emitter diffusion source and an electrode; and elements included in the transistor are isolated from each other by using a local oxidization layer provided into the surface of a region of the epitaxial layer in the vicinity of the transistor.

9. A circuit-incorporating light receiving device according to claim 8, further comprising a silicon oxidization film provided so as to substantially cover the epitaxial layer.

* * * * *